US012692384B2

(12) United States Patent
Ikehira

(10) Patent No.: US 12,692,384 B2
(45) Date of Patent: Jul. 28, 2026

(54) RESIN SHEET

(71) Applicant: Ajinomoto Co., Inc., Tokyo (JP)

(72) Inventor: Shu Ikehira, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 151 days.

(21) Appl. No.: 18/466,987

(22) Filed: Sep. 14, 2023

(65) Prior Publication Data

US 2024/0034874 A1 Feb. 1, 2024

Related U.S. Application Data

(63) Continuation of application No. PCT/JP2022/011679, filed on Mar. 15, 2022.

(30) Foreign Application Priority Data

Mar. 16, 2021 (JP) ................................. 2021-042917

(51) Int. Cl.
*H05K 1/03* (2006.01)
*C08J 5/18* (2006.01)
*C08K 3/013* (2018.01)
*C08K 5/00* (2006.01)
*C08L 63/00* (2006.01)

(52) U.S. Cl.
CPC ................. *C08L 63/00* (2013.01); *C08J 5/18* (2013.01); *C08K 3/013* (2018.01); *C08K 5/0025* (2013.01); *H05K 1/0326* (2013.01); *C08K 2201/003* (2013.01)

(58) Field of Classification Search
CPC ....... H05K 1/0373; C08L 63/00; C08K 3/013; C08K 5/0025; C08J 5/18
See application file for complete search history.

(56) References Cited

U.S. PATENT DOCUMENTS

| | | | | |
|---|---|---|---|---|
| 2011/0139496 | A1 | 6/2011 | Nakamura | |
| 2016/0042836 | A1 | 2/2016 | Okabe et al. | |
| 2016/0060408 | A1 * | 3/2016 | Chujo .................. | H05K 1/0373 523/400 |
| 2021/0002475 | A1 | 1/2021 | Namekata et al. | |
| 2024/0034874 | A1 | 2/2024 | Ikehira | |

FOREIGN PATENT DOCUMENTS

| | | | |
|---|---|---|---|
| CN | 110922741 | A | 3/2020 |
| CN | 111196890 | A | 5/2020 |
| JP | 2011-144361 | A | 7/2011 |
| JP | 2011-219674 | A | 11/2011 |
| JP | 2013-203950 | A | 10/2013 |
| JP | 2016-39042 | A | 3/2016 |
| JP | 2016-74849 | A | 5/2016 |
| JP | 2016-79366 | A | 5/2016 |
| JP | 2016-84413 | A | 5/2016 |
| JP | 2018-125378 | A | 8/2018 |
| JP | 2019-178198 | A | 10/2019 |
| JP | 2020-37652 | A | 3/2020 |
| JP | 2020-83966 | | 6/2020 |
| JP | 2020-158704 | A | 10/2020 |
| JP | 2021-008583 | A | 1/2021 |
| JP | 6809014 | B2 | 1/2021 |
| JP | 2022-124401 | A | 8/2022 |
| JP | 7367891 | B2 | 10/2023 |

OTHER PUBLICATIONS

Japanese Notice of Reasons for Revocation issued Aug. 27, 2024 in Japanese Patent Application No. 2024-700365 (with unedited computer-generated English Translation), 35 pages.
“2-Methoxy-1-propanol”, Fire and Disaster Management Agency, Jan. 21, 2022, 3 pages( (with English Translation).
2-Methoxypropan-1-ol Tokyo Chemical Industry Co., Ltd., printed Mar. 31, 2024, 11 pages (with English Translation).
International Search Report in Application PCT/JP2022/011679 issued May 24, 2022.
Notification of Reason for Refusal (Application No. 2023-507134) Jun. 16, 2023 (3 pgs.).
Combined Taiwanese Office Action and Search Report issued Jul. 15, 2025 in Taiwanese Patent Application No. 111109601, 16 pgs.

* cited by examiner

*Primary Examiner* — Jeremy C Norris
(74) *Attorney, Agent, or Firm* — Oblon, McClelland, Maier & Neustadt, L.L.P.

(57) ABSTRACT

A resin sheet including a support and a resin composition layer formed on the support, in which the resin composition layer contains (A) an epoxy resin, (B) an organic solvent, (C) an inorganic filler, and (D) a stress relaxing material, in which a content of an aromatic solvent having a boiling point of lower than 120° C. in the (B) component is in the range of 0 to 9% by mass relative to 100% by mass of total of the (B) component, can suppress an irregularity after lamination and a warpage after curing.

25 Claims, No Drawings

RESIN SHEET

CROSS REFERENCES TO RELATED APPLICATIONS

This application is a continuation of International Patent Application No. PCT/JP2022/011679, filed on Mar. 15, 2022, and claims priority to Japanese Patent Application No. 2021-042917, filed on Mar. 16, 2021, both of which are incorporated herein by reference in their entireties.

BACKGROUND OF THE INVENTION

Field of the Invention

The present invention relates to resin sheets including a resin composition (layer) containing an epoxy resin and an inorganic filler.

Discussion of the Background

As a manufacturing technology for a printed wiring board, the build-up type manufacturing method, in which an insulating layer and a conductor layer are alternately stacked, is known. In the build-up type manufacturing method, the insulating layer is generally formed by curing a resin composition. In recent years, there has been a demand for a lower dielectric loss tangent of the insulating layer.

It has been known that by using an epoxy resin composition blended with an inorganic filler as the resin composition for forming the insulating layer, the dielectric loss tangent of the insulating layer can be lowered furthermore. It is also known that blending a stress relaxing material can suppress a warpage of the resin composition after curing (see JP 6809014B, which is incorporated herein by reference in its entirety).

SUMMARY OF THE INVENTION

However, when an epoxy resin composition containing a stress relaxing material and an inorganic filler was used, there was a problem of an irregularity after lamination because the stress relaxing material was incompatible in the epoxy resin composition and the inorganic filler increased a melt viscosity of the composition (for details of the irregularity after lamination, see Test Example 4).

Accordingly, it is an object of the present invention is to provide a resin sheet that can suppress the irregularity after lamination and a warpage after curing.

This and other objects, which will become apparent during the following detailed description have been achieved by the inventor's discovery that when a resin sheet including a resin composition (layer) containing (A) an epoxy resin, (B) an organic solvent, (C) an inorganic filler, and (D) a stress relaxing material, in which a content of an aromatic solvent having a boiling point of 120° C. or lower in the (B) component is in the range of 0 to 9% by mass relative to 100% by mass of total of the (B) component, was used, the irregularity after lamination and a warpage after curing could be unexpectedly suppressed; leading to completion of the present invention.

Namely, the present invention includes the following embodiments:

(1) A resin sheet comprising:
a support; and
a resin composition layer formed on the support, wherein
the resin composition layer comprises (A) an epoxy resin, (B) an organic solvent, (C) an inorganic filler, and (D) a stress relaxing material, and
a content of an aromatic solvent having a boiling point of lower than 120° C. in the (B) component is in a range of 0 to 9% by mass relative to 100% by mass of total of the (B) component.

(2) The resin sheet according to (1), wherein a content of the (D) component in the resin composition layer is 1% or more by mass relative to 100% by mass of nonvolatile components in the resin composition layer.

(3) The resin sheet according to (1) or (2), wherein a content of the (C) component in the resin composition layer is 60% or more by mass relative to 100% by mass of nonvolatile components in the resin composition layer.

(4) The resin sheet according to any one of (1) to (3), wherein a product of a value of a content (% by mass) of the (C) component and a value of a specific surface area ($m^2/g$) of the (C) component, when nonvolatile components in the resin composition layer account for 100% by mass, is 300 or more.

(5) The resin sheet according to any one of (1) to (4), wherein a content of an organic solvent having a boiling point of lower than 120° C. in the (B) component is in a range of 0 to 30% by mass relative to 100% by mass of total of the (B) component.

(6) The resin sheet according to any one of (1) to (5), wherein a content of an organic solvent having a boiling point of 220° C. or higher in the (B) component is in a range of 0 to 10% by mass relative to 100% by mass of total of the (B) component.

(7) The resin sheet according to any one of (1) to (6), wherein a content of an aromatic solvent in the (B) component is in a range of 0 to 9% by mass relative to 100% by mass of total of the (B) component.

(8) The resin sheet according to any one of (1) to (7), wherein a content of an organic solvent having a boiling point in a range of 120° C. or higher to lower than 220° C. in the (B) component is 85% or more by mass relative to 100% by mass of total of the (B) component.

(9) The resin sheet according to any one of (1) to (8), wherein the (D) component comprises a non-particulate stress relaxing material containing a resin having one or more structures selected from a polybutadiene structure and a polycarbonate structure.

(10) The resin sheet according to any one of (1) to (9), wherein the (D) component comprises a particulate stress relaxing material.

(11) The resin sheet according to (10), wherein an average particle diameter of the particulate stress relaxing material is 10,000 nm or less.

(12) The resin sheet according to any one of (1) to (11), wherein the resin composition layer further comprises (E) a curing agent.

(13) The resin sheet according to (12), wherein the (E) component comprises one or more curing agents selected from an active ester type curing agent and a carbodiimide type curing agent.

(14) The resin sheet according to (13), wherein the (E) component comprises the active ester type curing agent.

(15) The resin sheet according to any one of (1) to (14), wherein the resin composition layer further comprises (F) a curing accelerator.

(16) The resin sheet according to any one of (1) to (15), wherein the resin composition layer further comprises (G) a radical polymerizable compound.

(17) The resin sheet according to (16), wherein the (G) component has a maleimide group.

(18) The resin sheet according to any one of (1) to (17), wherein a weight reduction rate of the resin composition layer with a side of the resin sheet not in contact with the support exposed to outside air and heat-treated at 190° C. for 30 minutes is in a range of 1 to 10% by mass.

(19) The resin sheet according to any one of (1) to (18), wherein a dielectric loss tangent (Df) of the resin composition layer after curing is 0.0090 or less when measured at 10 GHz and 23° C.

(20) The resin sheet according to any one of (1) to (19), wherein a melt viscosity of the resin composition layer at 100° C. is 50,000 poise or lower.

(21) A method for manufacturing a printed wiring board, the method comprising processes of (I) and (II):
 (I) a process of laminating the resin sheet according to any one of (1) to (20) such that the resin composition layer of the resin sheet is bonded to an inner layer substrate; and
 (II) a process of forming an insulating layer by curing the resin composition layer.

(22) A resin composition comprising:
 (A) an epoxy resin;
 (B) an organic solvent;
 (C) an inorganic filler; and
 (D) a stress relaxing material, wherein
 a content of an aromatic solvent having a boiling point of lower than 120° C. in the (B) component is in a range of 0 to 9% by mass relative to 100% by mass of total of the (B) component.

Effects of the Invention

According to the resin sheet of the present invention, the irregularity after lamination can be suppressed, and also the warpage after curing can be suppressed.

DETAILED DESCRIPTION OF THE PREFERRED EMBODIMENTS

Hereinafter, the present invention will be described in detail based on the preferred embodiments thereof. Herein, it must be noted that the present invention is not limited to the embodiments and examples described below, and that the present invention may be carried out with any arbitrary modification as long as such modification is not outside the claims or the equivalent thereof in the present invention.

Resin Sheet

The resin sheet according to the present invention has a support and a resin composition (layer) on the support.

Resin Composition (Layer)

The thickness of the resin composition (layer) in the resin sheet according to the present invention is not particularly restricted, but from the viewpoint of thinning, it is preferably 250 μm or less, more preferably 200 μm or less, still more preferably 150 μm or less, and especially preferably 100 μm or less. There is no particular restriction in the lower limit of the thickness of the resin composition (layer); for example, the lower limit can be 5 μm or more, 10 μm or more, or the like.

The resin composition (layer) in the resin sheet according to the present invention contains (A) an epoxy resin, (B) an organic solvent, (C) an inorganic filler, and (D) a stress relaxing material, in which a content of an aromatic solvent having a boiling point of 120° C. or lower in the (B) component is in the range of 0 to 9% by mass relative to 100% by mass of total of the (B) component. By using the resin sheet described above, the irregularity after lamination can be suppressed, and also the warpage after curing can be suppressed.

In addition to the (A) epoxy resin, the (B) organic solvent, the (C) inorganic filler, and the (D) stress relaxing material, the resin composition (layer) in the resin sheet according to the present invention may contain an optional component. The optional component may include, for example, (E) a curing agent, (F) a curing accelerator, (G) a radical polymerizable compound, (H) a thermoplastic resin, and (I) an other additive. Hereinafter, these components contained in the resin composition (layer) of the resin sheet according to the present invention will be described.

(A) Epoxy Resin

The resin composition (layer) in the resin sheet according to the present invention contains (A) an epoxy resin. The (A) epoxy resin is a curable resin having an epoxy group.

Illustrative examples of the (A) epoxy resin include a bisxylenol type epoxy resin, a bisphenol A type epoxy resin, a bisphenol F type epoxy resin, a bisphenol S type epoxy resin, a bisphenol AF type epoxy resin, a dicyclopentadiene type epoxy resin, a trisphenol type epoxy resin, a naphthol novolac type epoxy resin, a phenol novolac type epoxy resin, a tert-butyl-catechol type epoxy resin, a naphthalene type epoxy resin, a naphthol type epoxy resin, an anthracene type epoxy resin, a glycidylamine type epoxy resin, a glycidyl ester type epoxy resin, a cresol novolac type epoxy resin, a phenol aralkyl type epoxy resin, a biphenyl type epoxy resin, a linear aliphatic type epoxy resin, an epoxy resin having a butadiene structure, an alicyclic type epoxy resin, a heterocyclic type epoxy resin, an epoxy resin having a spiro ring, a cyclohexane type epoxy resin, a cyclohexane dimethanol type epoxy resin, a naphthylene ether type epoxy resin, a trimethylol type epoxy resin, a tetraphenylethane type epoxy resin, an isocyanurate type epoxy resin, and a phenolphthalimidine type epoxy resin. The (A) epoxy resin may be used singly or as a combination of two or more of these resins.

The resin composition (layer) in the resin sheet according to the present invention preferably contains, as the (A) epoxy resin, an epoxy resin having two or more epoxy groups in one molecule. The ratio of the epoxy resin having two or more epoxy groups in one molecule relative to 100% by mass of nonvolatile components in the (A) epoxy resin is preferably 50% or more by mass, more preferably 60% or more by mass, and especially preferably 70% or more by mass.

There are an epoxy resin that is in a liquid state at a temperature of 20° C. (hereafter this is sometimes referred to as "liquid epoxy resin") and an epoxy resin that is in a solid state at a temperature of 20° C. (hereinafter this is sometimes referred to as "solid epoxy resin"). The resin composition (layer) in the resin sheet according to the present invention may contain, as the epoxy resin, only the liquid epoxy resin, or only the solid epoxy resin, or both the liquid and solid epoxy resins; but it is preferable to contain both the liquid and solid epoxy resins.

The liquid epoxy resin is preferably the liquid epoxy resin having two or more epoxy groups in one molecule.

The liquid epoxy resin is preferably a glycylol type epoxy resin, a bisphenol A type epoxy resin, a bisphenol F type epoxy resin, a bisphenol AF type epoxy resin, a naphthalene type epoxy resin, a glycidyl ester type epoxy resin, a glycidylamine type epoxy resin, a phenol novolac type epoxy resin, an alicyclic type epoxy resin having an ester backbone, a cyclohexanedimethanol type epoxy resin, a cyclic aliphatic glycidyl ether, or an epoxy resin having a butadiene structure.

Specific examples of the liquid epoxy resin include: "EX-992L" manufactured by Nagase ChemteX Corp., "YX7400" manufactured by Mitsubishi Chemical Corp., and "HP4032", "HP4032D", and "HP4032SS" manufactured by DIC Corporation (all these are naphthalene type epoxy resins); "828US", "828EL", "825", and "Epikote 828EL" (bisphenol A type epoxy resins) manufactured by Mitsubishi Chemical Corp.; "jER807" and "1750" (bisphenol F type epoxy resins) manufactured by Mitsubishi Chemical Corp.; "jER152" (phenol novolac type epoxy resin) manufactured by Mitsubishi Chemical Corp.; "630", "630LSD", and "604" (glycidylamine type epoxy resins) manufactured by Mitsubishi Chemical Corp.; "ED-523T" (glycylol type epoxy resin) manufactured by ADEKA Corp.; "EP-3950L" and "EP-3980S" (glycidylamine type epoxy resins) manufactured by ADEKA Corp.; "EP-4088S" (dicyclopentadiene type epoxy resin) manufactured by ADEKA Corp.; "ZX1059" (mixture of bisphenol A type epoxy resin and bisphenol F type epoxy resin) manufactured by NIPPON STEEL Chemical & Material Co., Ltd.; EX-721" (glycidyl ester type epoxy resin) manufactured by Nagase ChemteX Corp.; "EX-991L" (epoxy resin having an alkyleneoxy backbone and a butadiene backbone) manufactured by Nagase ChemteX Corp.; "Celloxide 2021P" (alicyclic epoxy resin having an ester backbone) manufactured by Daicel Corp.; "PB-3600" manufactured by Daicel Corp., and "JP-100", "JP-200", and "JP-400" (epoxy resins having a butadiene structure) manufactured by Nippon Soda Co., Ltd.; "ZX1658" and "ZX1658GS" (liquid 1,4-glycidylcyclohexane epoxy type resins) manufactured by NIPPON STEEL Chemical & Material Co., Ltd.; "EG-280" (epoxy resin having a fluorene structure) manufactured by Osaka Gas Chemicals Co., Ltd.; and "EX-201" (cyclic aliphatic glycidyl ether) manufactured by Nagase ChemteX Corp.

The solid epoxy resin is preferably a solid epoxy resin having three or more epoxy groups in one molecule, and more preferably an aromatic solid epoxy resin having three or more epoxy groups in one molecule.

Illustrative examples of the preferable solid epoxy resin include a bixylenol type epoxy resin, a naphthalene type epoxy resin, a naphthalene tetrafunctional type epoxy resin, a naphthol novolac type epoxy resin, a cresol novolac type epoxy resin, a dicyclopentadiene type epoxy resin, a trisphenol type epoxy resin, a naphthol type epoxy resin, a biphenyl type epoxy resin, a naphthylene ether type epoxy resin, an anthracene type epoxy resin, a bisphenol A type epoxy resin, a bisphenol AF type epoxy resin, a phenol aralkyl type epoxy resin, a tetraphenylethane type epoxy resin, and a phenolphthalimidine type epoxy resin.

Specific examples of the solid epoxy resin include "HP4032H" (naphthalene type epoxy resin) manufactured by DIC Corporation; "HP-4700" and "HP-4710" (naphthalene tetrafunctional type epoxy resins) manufactured by DIC Corporation; "N-690" (cresol novolac type epoxy resin) manufactured by DIC Corporation; "N-695" (cresol novolac type epoxy resin) manufactured by DIC Corporation; "HP-7200", "HP-7200HH", "HP-7200H", and "HP-7200L" (dicyclopentadiene type epoxy resins) manufactured by DIC Corporation; "EXA-7311", "EXA-7311-G3", "EXA-7311-G4", "EXA-7311-G4S", "HP6000", and "HP6000L" (naphthylene ether type epoxy resins) manufactured by DIC Corporation; "EPPN-502H" (trisphenol type epoxy resin) manufactured by Nippon Kayaku Co., Ltd.; "NC7000L" (naphthol novolac type epoxy resin) manufactured by Nippon Kayaku Co., Ltd.; "NC3000H", "NC3000," "NC3000L," "NC3000FH", and "NC3100" (biphenyl type epoxy resins) manufactured by Nippon Kayaku Co., Ltd.; "ESN475V" and "ESN4100V" (naphthalene type epoxy resins) manufactured by NIPPON STEEL Chemical & Material Co., Ltd.; "ESN485" (naphthol type epoxy resin) manufactured by NIPPON STEEL Chemical & Material Co., Ltd.; "ESN375" (dihydroxynaphthalene type epoxy resin) manufactured by NIPPON STEEL Chemical & Material Co., Ltd.; "YX4000H", "YX4000", "YX4000HK", and "YL7890" (bixylenol type epoxy resins) manufactured by Mitsubishi Chemical Corp.; "YL6121" (biphenyl type epoxy resin) manufactured by Mitsubishi Chemical Corp.; "YX8800" (anthracene type epoxy resin) manufactured by Mitsubishi Chemical Corp.; "YX7700" (phenol aralkyl type epoxy resin) manufactured by Mitsubishi Chemical Corp.; "PG-100" and "CG-500" manufactured by Osaka Gas Chemical Co., Ltd.; "YX7760" (bisphenol AF type epoxy resin) manufactured by Mitsubishi Chemical Corp.; "YL7800" (fluorene type epoxy resin) manufactured by Mitsubishi Chemical Corp.; "jER1010" (bisphenol A type epoxy resin) manufactured by Mitsubishi Chemical Corp.; "jER1031S" (tetraphenylethane type epoxy resin) manufactured by Mitsubishi Chemical Corp.; and "WHR991S" (phenolphthalimidine type epoxy resin) manufactured by Nippon Kayaku Co., Ltd. These may be used singly or as a combination of two or more of them.

When the (A) epoxy resin is used as the combination of the solid epoxy resin and the liquid epoxy resin, the mass ratio of them (solid epoxy resin: liquid epoxy resin) is preferably in the range of 10:1 to 1:50, more preferably in the range of 2:1 to 1:20, and especially preferably in the range of 1:1 to 1:10.

The epoxy equivalent of the (A) epoxy resin is preferably in the range of 50 g/eq to 5,000 g/eq., more preferably in the range of 60 g/eq to 2,000 g/eq., still more preferably in the range of 70 g/eq to 1,000 g/eq. and far still more preferably in the range of 80 g/eq to 500 g/eq. The epoxy equivalent is the mass of the resin per one equivalent of the epoxy group. This epoxy equivalent may be measured according to JIS K7236.

The weight-average molecular weight (Mw) of the (A) epoxy resin is preferably in the range of 100 to 5,000, more preferably in the range of 250 to 3,000, and still more preferably in the range of 400 to 1,500. The weight-average molecular weight (Mw) of the resin can be measured by a gel permeation chromatography (GPC) method in terms of the polystyrene.

The content of the (A) epoxy resin in the resin composition (layer) is not particularly restricted, but the content is preferably 30% or less by mass, more preferably 25% or less by mass, still more preferably 20% or less by mass, far still more preferably 15% or less by mass, and especially preferably 10% or less by mass, relative to 100% by mass of the nonvolatile components in the resin composition (layer). The lower limit of the content of the (A) epoxy resin in the resin composition (layer) is not particularly restricted, but this is preferably 0.1% or more by mass, more preferably 0.5% or more by mass, still more preferably 1% or more by mass, far still more preferably 3% or more by mass, and especially preferably 5% or more by mass, relative to 100% by mass of the nonvolatile components in the resin composition (layer).

(B) Organic Solvent

The resin composition (layer) in the resin sheet according to the present invention contains (B) an organic solvent. The (B) organic solvent described herein is a liquid compound (compound that is liquid under a normal temperature (25° C.)) having a boiling point of 250° C. or lower and having neither a carbon-carbon double bond nor a carbon-carbon triple bond (excluding bonds constituting an aromatic ring) in the molecule composed of a backbone atom selected from a carbon atom and an oxygen atom. The (B) organic solvent described herein does not include those belonging to the (A) epoxy resin. The boiling point herein refers to the boiling point under a normal pressure (1 atm; 760 mmHg) (i.e., standard boiling point). The (B) organic solvent may be used singly or as a combination of two or more of these solvents.

The (B) organic solvent includes an aromatic solvent and a non-aromatic solvent.

The aromatic solvent is a solvent that contains an aromatic ring in its molecule. Illustrative examples of the aromatic solvent include: aromatic hydrocarbon solvents such as $C_{5-6}$ aromatic hydrocarbons including benzene (boiling point of 80° C.), toluene (boiling point of 110° C.), o-xylene (boiling point of 144° C.), m-xylene (boiling point of 139° C.), p-xylene (boiling point of 138° C.), and ethylbenzene (boiling point of 136° C.); C, aromatic hydrocarbons including 1,2,3-trimethylbenzene (boiling point of 176° C.), 1,3,5-trimethylbenzene (boiling point of 165° C.), 1,2,4-trimethylbenzene (boiling point of 169° C.), 4-ethyltoluene (boiling point of 161° C.), 3-ethyltoluene (boiling point of 160° C.), and 2-ethyltoluene (boiling point of 166° C.); and C, aromatic hydrocarbons including 1,2-diethylbenzene (boiling point of 184° C.), 1,3-diethylbenzene (boiling point of 181° C.), 1,4-diethylbenzene (boiling point of 183° C.), 3-ethyl-o-xylene (boiling point of 194° C.), 4-ethyl-o-xylene (boiling point of 190° C.), 2-ethyl-p-xylene (boiling point of 187° C.), and 1,2,3,5-tetramethylbenzene (boiling point of 198° C.); aromatic ketone solvents including acetophenone (boiling point of 202° C.); aromatic alcohol solvents including benzyl alcohol (boiling point of 205° C.) and phenethyl alcohol (boiling point of 219 to 221° C.); aromatic ether solvents including anisole (boiling point of 154° C.) and phenetole (boiling point of 169° C.); and aromatic ester solvents including methyl benzoate (boiling point of 198 to 200° C.) and ethyl benzoate (boiling point of 211 to 213° C.).

The non-aromatic solvent is a solvent that do not contain an aromatic ring in its molecule. Illustrative examples of the non-aromatic solvent include a glycol solvent, a glycol ether solvent, a glycol ether ester solvent, an aliphatic hydrocarbon solvent, an aliphatic ketone solvent, an aliphatic alcohol solvent, an aliphatic ester solvent, and an aliphatic ether solvent.

Illustrative examples of the glycol solvent include ethylene glycol (boiling point of 197° C.), diethylene glycol (boiling point of 244° C.), propylene glycol (boiling point of 188° C.), dipropylene glycol (boiling point of 232° C.), and trimethylene glycol (boiling point of 211 to 217° C.).

Illustrative examples of the glycol ether solvent include: cellosolves such as ethylene glycol monomethyl ether (also known as methyl cellosolve) (boiling point of 124° C.), ethylene glycol monoethyl ether (also known as cellosolve) (boiling point of 135° C.), ethylene glycol monopropyl ether (also known as propyl cellosolve) (boiling point of 151° C.), ethylene glycol monobutyl ether (also known as butyl cellosolve) (boiling point of 171° C.), ethylene glycol monoisobutyl ether (also known as isobutyl cellosolve) (boiling point of 160° C.), ethylene glycol mono-tert-butyl ether (also known as tert-butyl cellosolve) (boiling point of 152° C.), and ethylene glycol monohexyl ether (boiling point of 208° C.); carbitols such as diethylene glycol monomethyl ether (also known as methylcarbitol) (boiling point of 193° C.), diethylene glycol monoethyl ether (also known as carbitol) (boiling point of 196° C.), diethylene glycol monopropyl ether (also known as propylcarbitol) (boiling point of 212 to 216° C.), and diethylene glycol monobutyl ether (DB) (also known as butylcarbitol) (boiling point of 230° C.); propylene glycol ethers such as propylene glycol monomethyl ether (PGM) (boiling point of 120° C.), propylene glycol monoethyl ether (boiling point of 132° C.), propylene glycol monopropyl ether (boiling point of 150° C.), and propylene glycol monobutyl ether (boiling point of 170° C.); and dipropylene glycol ethers such as dipropylene glycol monomethyl ether (boiling point of 188° C.), dipropylene glycol monoethyl ether (boiling point of 198° C.), dipropylene glycol monopropyl ether (boiling point of 210° C.), and dipropylene glycol monobutyl ether (boiling point of 215° C.).

Illustrative examples of the glycol ether ester solvent include: cellosolve esters such as ethylene glycol monomethyl ether acetate (also known as methyl cellosolve acetate) (boiling point of 145° C.), ethylene glycol monoethyl ether acetate (also known as cellosolve acetate) (boiling point 156° C.), and ethylene glycol monobutyl ether acetate (also known as butyl cellosolve acetate) (boiling point of 191° C.); carbitol esters such as diethylene glycol monoethyl ether acetate (EDGAC) (also known as carbitol acetate (boiling point of 217° C.) and diethylene glycol monobutyl ether acetate (also known as butyl carbitol acetate) (boiling point of 247° C.); propylene glycol ether esters such as propylene glycol monomethyl ether acetate (PGMEA) (boiling point of 146° C.) and propylene glycol monoethyl ether acetate (boiling point of 160° C.); and dipropylene glycol ether esters such as dipropylene glycol monomethyl ether acetate (boiling point of 200° C.).

Illustrative examples of the aliphatic hydrocarbon solvent include n-pentane (boiling point of 36° C.), n-hexane (boiling point of 69° C.), 2-methylpentane (also known as isohexane) (boiling point of 60 to 62° C.), n-heptane (boiling point of 98° C.), n-octane (boiling point of 125° C.), cyclopentane (boiling point of 49° C.), cyclohexane (boiling point of 81° C.), methylcyclohexane (boiling point of 101° C.), and ethylcyclohexane (boiling point of 132° C.).

Illustrative examples of the aliphatic ketone solvent include: non-cyclic ketones such as acetone (boiling point of 56° C.), methyl ethyl ketone (MEK) (boiling point of 79° C.), diethyl ketone (boiling point of 101° C.), 2-pentanone (boiling point of 101° C.), methyl isobutyl ketone (boiling point of 116° C.), 2-hexanone (boiling point of 127° C.), 2-heptanone (MAK) (boiling point of 151° C.), and diisobutyl ketone (boiling point of 168° C.); and cyclic ketones such as cyclohexanone (Anone) (boiling point of 155° C.) and 2-methylcyclohexanone (boiling point of 162° C.).

Illustrative examples of the aliphatic alcohol solvent include methanol (boiling point of 64° C.), ethanol (boiling point of 78° C.), n-propanol (boiling point of 97° C.), isopropanol (2-propanol) (boiling point of 82° C.), n-butyl alcohol (boiling point of 117° C.), isobutyl alcohol (boiling point of 108° C.), sec-butyl alcohol (boiling point of 99° C.), tert-butyl alcohol (boiling point of 82° C.), n-pentyl alcohol (boiling point of 138° C.), isopentyl alcohol (boiling point of 131° C.), sec-pentyl alcohol (boiling point of 119° C.), tert-pentyl alcohol (boiling point of 102° C.), neopentyl alcohol (boiling point of 113° C.), n-hexyl alcohol (boiling point of 157° C.), n-heptyl alcohol (boiling point of 175° C.), isoheptyl alcohol (boiling point of 159° C.), n-octyl alcohol (boiling point of 195° C.), 2-ethylhexyl alcohol (boiling point of 184° C.), and cyclohexanol (boiling point of 161° C.).

Illustrative examples of the aliphatic ester solvent include: aliphatic acid alkyl esters such as methyl acetate (boiling point of 57° C.), ethyl acetate (boiling point of 77° C.), n-propyl acetate (boiling point of 96° C.), isopropyl acetate (boiling point of 89° C.), n-butyl acetate (boiling point of 126° C.), isobutyl acetate (boiling point of 118° C.), sec-butyl acetate (boiling point of 112° C.), tert-butyl acetate (boiling point of 97° C.), n-pentyl acetate (boiling point of 149° C.), isopentyl acetate (boiling point of 142° C.), ethyl propionate (boiling point of 99° C.), propyl propionate (boiling point of 122° C.), and isopropyl propionate (boiling point of 108° C.); alkyl esters of hydroxy acids such as methyl lactate (boiling point of 144 to 145° C.), ethyl lactate (boiling point of 151 to 155° C.), and butyl lactate (boiling point of 185 to 187° C.); alkyl ketoacid esters such as methyl acetoacetate (boiling point of 170° C.) and ethyl acetoacetate (boiling point of 184° C.); and lactones such as γ-butyrolactone (boiling point of 204° C.).

Illustrative examples of the aliphatic ether solvent include diethyl ether (boiling point of 34° C.), diisopropyl ether (boiling point of 68° C.), methyl tert-butyl ether (boiling point of 55° C.), tetrahydrofuran (boiling point of 66° C.), 1,4-dioxane (boiling point of 101° C.), and 1,3-dioxolane (boiling point of 75° C.).

The content of the aromatic solvent in the (B) organic solvent having the boiling point of lower than 120° C. contained in the resin composition (layer) relative to 100% by mass of total of the (B) organic solvent contained in the resin composition (layer) is in the range of 0 to 9% by mass, and from the viewpoints of further lowering the dielectric loss tangent and of further suppressing the warpage, the content is preferably in the range of 0 to 7% by mass, more preferably in the range of 0 to 5% by mass, still more preferably in the range of 0 to 3% by mass, far still more preferably in the range of 0 to 1% by mass, and especially preferably in the range of 0 to 0.1% by mass.

From the viewpoint of further suppressing the irregularity, the content of the aromatic solvent in the (B) organic solvent contained in the resin composition (layer) relative to 100% by mass of total of the (B) organic solvent contained in the resin composition (layer) is preferably in the range of 0 to 9% by mass, more preferably in the range of 0 to 7% by mass, still more preferably in the range of 0 to 5% by mass, and even still more preferably in the range of 0 to 3% by mass %, far still more preferably in the range of 0 to 1% by mass, and especially preferably in the range of 0 to 0.1% by mass.

The content of the organic solvent having the boiling point of lower than 120° C. in the (B) organic solvent in the resin composition (layer) relative to 100% by mass of total of the (B) organic solvent contained in the resin composition (layer) is, from the viewpoint of clearly obtaining the advantageous effects of the present invention, preferably in the range of 0 to 50% by mass, more preferably in the range of 0 to 40% by mass, still more preferably in the range of 0 to 30% by mass, far still more preferably in the range of 0 to 20% by mass, and especially preferably in the range of 0 to 15% by mass.

The content of organic solvent having a boiling point of 120° C. or higher and lower than 220° C. in the (B) organic solvent contained in the resin composition (layer) relative to 100% by mass of total of the (B) organic solvent contained in the resin composition (layer) is, from the viewpoint of clearly obtaining the advantageous effects of the present invention, preferably 50% or more by mass, more preferably 60% or more by mass, still more preferably 70% or more by mass, far still more preferably 80% or more by mass, and especially preferably 85% or more by mass.

The content of the organic solvent having a boiling point of 220° C. or higher in the (B) organic solvent contained in the resin composition (layer) relative to 100% by mass of total of the (B) organic solvent contained in the resin composition (layer) is, from the viewpoints of further lowering the dielectric loss tangent and further suppressing the warpage, preferably in the range of 0 to 25% by mass, more preferably in the range of 0% to 20% by mass, still more preferably in the range of 0% to 15% by mass, even still more preferably in the range of 0 to 10% by mass, far still more preferably in the range of 0% to 5% by mass, especially preferably in the range of 0 to 1% by mass, and ultimately preferably in the range of 0 to 0.1% by mass.

The content of the (B) organic solvent in the resin composition (layer) is not particularly restricted, but from the viewpoints of further lowering the dielectric loss tangent (Df) and further suppressing the warpage, this is preferably 10% or less by mass, more preferably 8% or less by mass, still more preferably 6% or less by mass, and especially preferably 5% or less by mass, relative to 100% by mass of the total components in the resin composition (layer). From the viewpoint of achieving a better laminability, the lower limit of the content of the (B) organic solvent in the resin composition (layer) is preferably 0.1% or more by mass, more preferably 0.2% or more by mass, still more preferably 0.5% or more by mass, and especially preferably 1% or more by mass, relative to 100% by mass of the total components in the resin composition (layer).

From the viewpoint that the weight reduction rate of the resin composition layer with the side of the resin sheet not in contact with the support exposed to the outside air and heat-treated at 190° C. (under normal pressure) for 30 minutes further lowers the dielectric loss tangent (Df) and further suppresses the warpage, the content of the (B) organic solvent in the resin composition (layer) is preferably 10% or less by mass, more preferably 9% or less by mass, still more preferably 8% or less by mass, and especially preferably 7% or less by mass; and from the viewpoint of achieving a better laminability, the lower limit of the said content is preferably 1% or more by mass, more preferably 1.4% or more by mass, still more preferably 1.6% or more by mass, and especially preferably 1.8% or more by mass.

(C) Inorganic Filler

The resin composition (layer) in the resin sheet according to the present invention contains (C) an inorganic filler. The (C) inorganic filler is contained in the resin composition (layer) in the form of particle.

An inorganic compound is used as the material for the (C) inorganic filler. Illustrative examples of the material for the (C) inorganic filler include silica, alumina, glass, cordierite, silicon oxide, barium sulfate, barium carbonate, talc, clay, mica powder, zinc oxide, hydrotalcite, boehmite, aluminum hydroxide, magnesium hydroxide, calcium carbonate, magnesium carbonate, magnesium oxide, boron nitride, aluminum nitride, magnesium nitride, aluminum borate, strontium carbonate, strontium titanate, calcium titanate, magnesium titanate, bismuth titanate, titanium dioxide, zirconium oxide, barium titanate, barium titanate zirconate, barium zirconate, calcium zirconate, zirconium phosphate, and zirconium phosphate tungstate. Among these, silica is particularly preferable. Illustrative examples of the silica include amorphous silica, fused silica, crystalline silica, synthetic silica, and hollow silica. Spherical silica is preferable as the silica. The (C) inorganic filler may be used singly or as a combination of two or more of these fillers at any mixing ratio.

Illustrative examples of the commercially available (C) inorganic filler include "SP60-05" and "SP507-05", both manufactured by NIPPON STEEL Chemical & Material Co., Ltd.; "YC100C", "YA050C", "YA050C-MJE", and "YA010C", all manufactured by Admatechs Co., Ltd.; "UFP-30" manufactured by Denka Co., Ltd.; "Silfil NSS-3N", "Silfil NSS-4N", and "Silfil NSS-5N", all manufactured by Tokuyama Corp.; "SC2500SQ", "SO—C4", "SO—C2", and "SO—C1", all manufactured by Admatechs Co., Ltd.; and "DAW-03" and "FB-105FD", both manufactured by Denka Co., Ltd.

The average particle diameter of the (C) inorganic filler is not particularly limited, but the diameter is preferably 10 μm or less, more preferably 5 μm or less, still more preferably 3 μm or less, far still more preferably 2 μm or less, and especially preferably 1.5 μm or less. The lower limit of the average particle diameter of the (C) inorganic filler is not particularly limited, but the lower limit is preferably 0.01 μm or more, more preferably 0.05 μm or more, still more preferably 0.1 μm or more, and especially preferably 0.2 μm or more. The average particle diameter of the (C) inorganic filler may be measured with a laser diffraction scattering method based on the Mie scattering theory. Specifically, the particle diameter distribution of the inorganic filler is prepared on a volume basis by using a laser diffraction scattering type particle diameter distribution measurement instrument, in which the median diameter thereof can be measured as the average particle diameter. The measurement sample to be used may be obtained by weighing 100 mg of an inorganic filler and 10 g of methyl ethyl ketone into a vial, which is then followed by dispersing the filler by means of an ultrasonic wave for 10 minutes. The volume-based particle size distribution of the measurement sample of the inorganic filler was measured by the flow cell method, using a laser diffraction particle size distribution measurement instrument with blue and red lights as the source wavelengths. Illustrative examples of the laser diffraction scattering type particle diameter distribution measurement instrument include "LA-960" manufactured by Horiba Ltd.

The specific surface area of the (C) inorganic filler is not particularly limited, but this is preferably 0.1 m/g or more, more preferably 0.5 $m^2$/g or more, still more preferably 1 $m^2$/g or more, and especially preferably 3 m/g or more. The upper limit of the specific surface area of the (C) inorganic filler is not particularly limited, but this is preferably 100 $m^2$/g or less, more preferably 70 n/g or less, still more preferably 50 $m^2$/g or less, far still more preferably 30 m/g or less, and especially preferably 10 $m^2$/g or less. The specific surface area of the inorganic filler may be obtained by adsorbing a nitrogen gas onto the sample surface using a specific surface area measurement instrument (Macsorb HM-1210 manufactured by Mountech Co., Ltd.) according to the BET method and calculating the specific surface area using the BET multipoint method.

The (C) inorganic filler is preferably treated with a surface treatment agent to enhance moisture resistance and dispersibility. Illustrative examples of the surface treatment agent include a fluorine-containing silane coupling agent, an aminosilane type coupling agent, an epoxysilane type coupling agent, a mercaptosilane type coupling agent, a silane type coupling agent, an alkoxysilane, an organosilazane compound, and a titanate type coupling agent. The surface treatment agent may be used singly or as an arbitrary combination of two or more of these agents.

Illustrative examples of the commercially available surface treatment agent include "KBM403" (3-glycidoxypropyltrimethoxysilane) manufactured by Shin-Etsu Chemical Co., Ltd., "KBM803" (3-mercaptopropyltrimethoxysilane) manufactured by Shin-Etsu Chemical Co., Ltd., "KBE903" (3-aminopropyltrimethoxysilane) manufactured by Shin-Etsu Chemical Co., Ltd., "KBM573" (N-phenyl-3-aminopropyltrimethoxysilane) manufactured by Shin-Etsu Chemical Co., Ltd., "SZ-31" (hexamethyldisilazane) manufactured by Shin-Etsu Chemical Co., Ltd., "KBM103" (phenyltrimethoxysilane) manufactured by Shin-Etsu Chemical Co., Ltd., "KBM-4803" (long chain epoxy type silane coupling agent) manufactured by Shin-Etsu Chemical Co., Ltd., and "KBM-7103" (3,3,3-trifluoropropyltrimethoxysilane) manufactured by Shin-Etsu Chemical Co., Ltd.

The degree of the surface treatment by the surface treatment agent is preferably within a predetermined range from the viewpoint of improving the dispersibility of the inorganic filler. Specifically, 100% by mass of the inorganic filler is surface-treated by the surface treatment agent with the degree of preferably 0.2 to 5% by mass, more preferably 0.2 to 3% by mass, and still more preferably 0.3 to 2% by mass.

The degree of the surface treatment by the surface treatment agent may be evaluated by the carbon amount per unit surface area of the inorganic filler. From the viewpoint of improving the dispersibility of the inorganic filler, the carbon amount per unit surface area of the inorganic filler is preferably 0.02 mg/$m^2$ or more, more preferably 0.1 mg/$m^2$ or more, and still more preferably 0.2 mg/$m^2$ or more. On the other hand, from the viewpoint of preventing an increase in melt viscosity of the resin composition or of the sheet form, the carbon amount is preferably 1.0 mg/$m^2$ or less, more preferably 0.8 mg/$m^2$ or less, and still more preferably 0.5 mg/$m^2$ or less.

The carbon amount per unit surface area of the (C) inorganic filler may be measured after the surface-treated inorganic filler is washed with a solvent (e.g., methyl ethyl ketone (MEK)). Specifically, a sufficient amount of MEK as the solvent is added to the inorganic filler treated with the surface treatment agent, and then, this is subjected to cleaning by means of an ultrasonic wave at 25° C. for 5 minutes. After removing the supernatant liquid and drying the solid portion, the carbon amount per unit surface area of the inorganic filler can be measured using a carbon analyzer. Illustrative examples of the carbon analyzer include "EMIA-320V" manufactured by Horiba Ltd.

The content of the (C) inorganic filler in the resin composition (layer) is not particularly restricted, but the content is preferably 95% or less by mass, more preferably 90% or less by mass, still more preferably 85% or less by mass, and especially preferably 80% or less by mass, relative to 100% by mass of the nonvolatile components in the resin composition (layer). The lower limit of the content of the (C) inorganic filler in the resin composition (layer) is not particularly restricted, but from the viewpoint of further lowering the dielectric loss tangent, the content is preferably 5% or more by mass, or 10% or more by mass, more preferably 20% or less by mass, or 30% or more by mass, still more preferably 40% or more by mass, or 50% or more by mass, far still more preferably 55% or more by mass, or 60% or more by mass, and especially preferably 65% or more by mass, or 70% or more by mass, relative to 100% by mass of the nonvolatile components in the resin composition (layer).

From the viewpoint of further suppressing the warpage during curing and further lowering the dielectric loss tangent, the product of the value of the content (% by mass) of the (C) inorganic filler relative to 100% by mass of the nonvolatile components in the resin composition (layer), and the value of the specific surface area ($m^2/g$) of the (C) inorganic filler is preferably 230 or more, more preferably 250 or more, still more preferably 280 or more, and especially preferably 300 or more.

(D) Stress Relaxing Material

The resin composition (layer) in the resin sheet according to the present invention contains (D) a stress relaxing material. The (D) stress relaxing material refers to a resin having flexibility, and can be a particulate resin component (particulate stress relaxing material) that maintains a particle form in the resin composition (layer), or a non-particulate resin component (non-particulate stress relaxing material) that tends to be miscible or soluble in the resin composition (layer), and the material may contain only one of them or both, in which the resin component forming them can be a resin exhibiting a rubber elasticity by itself or a resin exhibiting a rubber elasticity by reacting with other components. The resin that exhibits the rubber elasticity is, for example, the resin that exhibits an elastic modulus of 1 GPa or less upon conducting the tensile test at the temperature of 25° C. and the humidity of 40% RH in accordance with the Japanese Industrial Standards (JIS K7161).

The particulate stress relaxing material is preferably spherical in its shape. The particulate stress relaxing material may be a hollow particle having a pore inside the particle or a non-hollow particle not having a pore inside the particle. The hollow particle may be a single hollow particle having only one pore inside the particle, or a multi-hollow particle having a plurality of pores inside the particle.

The particulate stress relaxing material is a rubber particle containing a rubber component, in which illustrative, preferable examples thereof include: silicone type elastomers such as polydimethylsiloxane; olefinic type thermoplastic elastomers such as polybutadiene, polyisoprene, polychlorobutadiene, ethylene-vinyl acetate copolymer, styrene-butadiene copolymer, styrene-isoprene copolymer, styrene-isobutylene copolymer, acrylonitrile-butadiene copolymer, isoprene-isobutylene copolymer, isobutylene-butadiene copolymer, ethylene-propylene-butadiene ternary copolymer, and ethylene-propylene-butene ternary copolymer; and acrylic type thermoplastic elastomers such as propyl poly(meth)acrylate, butyl poly(meth)acrylate, cyclohexyl poly(meth)acrylate, and octyl poly(meth)acrylate. In addition, a silicone type rubber such as polyorganosiloxane rubber may be mixed with the rubber component. The rubber component contained in the rubber particle has a glass transition temperature of, for example, 0° C. or lower, preferably −10° C. or lower, more preferably −20° C. or lower, and still more preferably −30° C. or lower.

From the viewpoint of obtaining the desired advantageous effects of the present invention in a pronounced manner, it is preferable that the particulate stress relaxing material contain a core-shell type rubber particle. The core-shell type rubber particle is the particulate stress relaxing material consisting of a core particle that contains the rubber component as mentioned above and one or more layers of a shell portion that covers the core particle. Furthermore, the core-shell type rubber particle is preferably the core-shell type graft copolymer rubber particle consisting of the core particle containing the rubber component as mentioned above and the shell portion that is the graft copolymer copolymerized with a monomer component that is capable of copolymerizing with the rubber component contained in the core particle. The core-shell type here does not necessarily refer only to those in which the core particle and the shell portion are clearly distinguishable, but also includes those in which not only the boundary between the core particle and the shell portion is unclear, but also the core particle is not completely covered with the shell portion.

It is preferable that the rubber component be contained in an amount of 40% or more by mass, more preferably 50% or more by mass, and still more preferably 60% or more by mass, in the core-shell rubber particle. The upper limit of the content of the rubber component in the core-shell rubber particle is not particularly restricted, but from the viewpoint of sufficiently covering the core particle with the shell portion, it is preferably 95% or less by mass, for example, 90% by mass.

Illustrative examples of the monomer component forming the shell portion of the core-shell type rubber particle include: (meth)acrylate esters such as methyl (meth)acrylate, ethyl (meth)acrylate, butyl (meth)acrylate, cyclohexyl (meth)acrylate, octyl (meth)acrylate, and glycidyl (meth)acrylate; (meth)acrylic acid; N-substituted maleimides such as N-methylmaleimide and N-phenylmaleimide; maleimide; α,β-unsaturated carboxylic acids such as maleic acid and itaconic acid; aromatic vinyl compounds such as styrene, 4-vinyltoluene, and α-methylstyrene; and (meth)acrylonitrile; among these, it is preferable to contain the (meth)acrylate esters, and more preferably to contain methyl (meth)acrylate. The term "(meth)acrylic acid" refers to methacrylic acid or acrylic acid.

Illustrative examples of the commercial product of the core-shell type rubber particle include: "CHT" manufactured by Cheil Industries Inc.; "B602" manufactured by UMG ABS, Ltd.; "Paraloid EXL-2602", "Paraloid EXL-2603", "Paraloid EXL-2655", "Paraloid EXL-2311", "Paraloid EXL2313", "Paraloid EXL-2315", "Paraloid KM-330", "Paraloid KM-336P", and "Paraloid KCZ-201", all manufactured by Dow Chemical Japan Ltd.; "Metablen C-223A", "Metablen E-901", "Metablen S-2001", "Metablen W-450A", and "Metablen SRK-200", all manufactured by Mitsubishi Rayon Co., Ltd.; "Kane Ace M-511", "Kane Ace M-600", "Kane Ace M-400", "Kane Ace M-580", and "Kane Ace MR-01", all manufactured by Kaneka Corp.; and "ΔC3401N" and "ΔC3816N", both manufactured by Ganz Chemical Co Ltd.

The average particle diameter (average primary particle diameter) of the particulate stress relaxing material is not particularly restricted, but this is preferably 20 nm or more, more preferably 30 nm or more, and still more preferably 50 nm or more. The upper limit of the average particle diameter (average primary particle diameter) of the particulate stress relaxing material is not particularly restricted, but this is preferably 10,000 nm or less, more preferably 5,000 nm or less, and still more preferably 1,000 nm or less. The average particle diameter (average primary particle diameter) of the particulate stress relaxing material may be measured using a zeta potential particle diameter distribution measurement instrument or the like.

The non-particulate stress relaxing material contains a resin having preferably one or more structures selected from a polybutadiene structure, a polysiloxane structure, a poly(meth)acrylate structure, a polyalkylene structure, a polyalkyleneoxy structure, a polyisoprene structure, a polyisobutylene structure, and a polycarbonate structure in its molecule; more preferably a resin having one or more structures selected from a polybutadiene structure and a polycarbonate structure; and especially preferably a resin having a polybutadiene structure and a phenolic hydroxy group (polybutadiene resin containing a phenolic hydroxy group), or a polycarbonate structure (polycarbonate resin). The term "(meth)acrylate" refers to methacrylate and acrylate.

The polybutadiene structure includes not only the structure formed by polymerization of butadiene, but also the structure formed by hydrogenation of the said structure. The polybutadiene structure may be hydrogenated only in part or all of the said structure. Furthermore, the polybutadiene structure may be contained in the main chain or in the side chain in the molecule of the stress relaxing material.

Preferable examples of the polybutadiene resin include a resin containing a hydrogenated polybutadiene backbone, a polybutadiene resin containing a hydroxy group, a polybutadiene resin containing a phenolic hydroxy group, a polybutadiene resin containing a carboxy group, a polybutadiene resin containing an acid anhydride group, a polybutadiene resin containing an epoxy group, a polybutadiene resin containing an isocyanate group, and a polybutadiene resin containing a urethane group. Among these, a polybutadiene resin containing a phenolic hydroxy group and a polybutadiene resin containing an epoxy group are still more preferable, and a polybutadiene resin containing a phenolic hydroxy group is especially preferable. Herein, "the resin containing a hydrogenated polybutadiene backbone" refers to a resin in which at least part of the polybutadiene backbone is hydrogenated; so, it is not necessary that the polybutadiene backbone is completely hydrogenated. An epoxy resin containing a hydrogenated polybutadiene backbone may be an example of the resin containing a hydrogenated polybutadiene backbone. Examples of the preferable polybutadiene resin containing a phenolic hydroxy group include a resin obtained from raw materials, i.e., a hydroxy-terminated polybutadiene, a diisocyanate compound, and a resin containing a phenolic hydroxy group. Herein, the hydroxy-terminated polybutadiene and the diisocyanate compound are the same as those described in the examples below. A cresol novolac resin may be an example of the resin containing a phenolic hydroxy group.

Specific examples of the polybutadiene resin include "PB-3600" (polybutadiene containing an epoxy group) manufactured by Daicel Corp.; "JP-100" and "JP-200" (polybutadienes containing an epoxy group), both manufactured by Nippon Soda Co., Ltd.; "Ricon 657" (polybutadiene containing an epoxy group), "Ricon 130MA8", "Ricon 130MA13", "Ricon 130MA20", "Ricon 131MA5", "Ricon 131MA10", "Ricon 131MA17", "Ricon 131MA20", and "Ricon 184MA6" (polybutadienes containing an acid anhydride groups), as well as "GQ-1000" (polybutadiene introduced with a hydroxy group and a carboxyl group), all manufactured by Cray Valley SA; "G-1000", "G-2000", and "G-3000" (polybutadienes having hydroxy groups at both ends), and "GI-1000", "GI-2000", and "GI-3000" (hydrogenated polybutadienes having hydroxy groups at both ends), all manufactured by Nippon Soda Co., Ltd.; "PB3600" and "PB4700" (epoxy compounds containing polybutadiene backbone), both manufactured by Daicel Corp.; "Epofriend A1005", "Epofriend A1010", and "Epofriend A1020" (epoxidized styrene-butadiene-styrene block copolymers), all manufactured by Daicel Corp.; and "FCA-061L" (epoxy compound having a hydrogenated polybutadiene backbone) and "R-45EPT" (epoxy compound having a polybutadiene backbone), both manufactured by Nagase ChemteX Corp.

A linear polyimide obtained from raw materials, i.e., a hydroxy-terminated polybutadiene, a diisocyanate compound, and a polybasic acid or its anhydride (polyimide described in JP-A-2006-37083 and in WO2008/153208) may also be cited as another preferable example of the polybutadiene resin. The content of the polybutadiene structure in this polyimide resin is preferably in the range of 60 to 95% by mass, and more preferably in the range of 75 to 85% by mass. For details of the polyimide resin, see JP-A-2006-37083 and WO2008/153208; the contents therein being incorporated into this specification.

The number-average molecular weight of the hydroxy-terminated polybutadiene is preferably in the range of 500 to 5,000, and more preferably in the range of 800 to 3,500. The hydroxy equivalent of the hydroxy-terminated polybutadiene is preferably in the range of 250 to 5,000 g/eq. and more preferably in the range of 1,000 to 3,000 g/eq.

Illustrative examples of the diisocyanate compound include aromatic diisocyanates such as toluene-2,4-diisocyanate, toluene-2,6-diisocyanate, xylylene diisocyanate, and diphenylmethane diisocyanate; aliphatic diisocyanates such as hexamethylene diisocyanate; and alicyclic diisocyanates such as isophorone diisocyanate. Among these, aromatic diisocyanates are preferable, and toluene-2,4-diisocyanate is more preferable.

Illustrative examples of the polybasic acid or its anhydride include: tetrabasic acids such as ethylene glycol bistrimellitic acid, pyromellitic acid, benzophenone tetracarboxylic acid, biphenyl tetracarboxylic acid, naphthalene tetracarboxylic acid, 5-(2,5-dioxotetrahydrofuryl)-3-methyl-cyclohexene-1,2-dicarboxylic acid, and 3,3'-4,4'-diphenylsulfonetetracarboxylic acid, as well as their anhydrides; tribasic acids such as trimellitic acid and cyclohexane tricarboxylic acid, as well as their anhydrides; and 1,3,3a,4,5,9b-hexahydro-5-(tetrahydro-2,5-dioxo-3-furanyl)-naphtho(1,2-C)-furan-1,3-dione.

The polybutadiene resin can also contain a polystyrene structure having the structure that is obtained by polymerization of styrene.

Specific examples of the polystyrene resin, which is the resin having a polystyrene structure, include styrene-butadiene-styrene block copolymer (SBS), styrene-isoprene-styrene block copolymer (SIS), styrene-ethylene-butylene-styrene block copolymer (SEBS), styrene-ethylene-propylene-styrene block copolymer (SEPS), styrene-ethylene-ethylene-propylene-styrene block copolymer (SEEPS), styrene-butadiene-butylene-styrene block copolymer (SBBS), styrene-butadiene diblock copolymer, hydrogenated styrene-butadiene block copolymer, hydrogenated styrene-isoprene block copolymer, and hydrogenated styrene-butadiene random copolymer.

Commercially available polystyrene resins may be used; so, illustrative examples thereof include: hydrogenated styrenic thermoplastic elastomers "H1041", "TUFTEC H1043", "TUFTEC P2000", and "TUFTEC MP10" (all manufactured by Asahi Kasei Corp.); epoxidized styrene-butadiene thermoplastic elastomers "Epofriend AT501" and "CT310" (both manufactured by Daicel Corp.); modified styrenic elastomer having a hydroxy group "SEPTON HG252" (manufactured by Kuraray Co., Ltd.); modified styrenic elastomer having a carboxyl group "TUFTEC N503M", modified styrenic elastomer having an amino group "TUFTEC N501", and modified styrenic elastomer having an acid anhydride group "TUFTEC M1913" (all manufactured by Asahi Kasei Chemicals Corp.); and unmodified styrenic elastomer "SEPTON 58104" (manufactured by Kuraray Co., Ltd.). The (D) component may be used singly or as a combination of two or more of these materials.

The polysiloxane structure is a structure containing a siloxane bond and is included in the silicone rubber, for example. The polysiloxane structure may be included in the main chain or in the side chain in the molecule of the stress relaxing material.

Specific examples of the polysiloxane resin, which is the resin having an intramolecular polysiloxane structure, include "SMP-2006", "SMP-2003PGMEA", and "SMP-5005PGMEA", all manufactured by Shin-Etsu Silicone, Inc., as well as a linear polyimide obtained from a polysiloxane terminated with an amino group and tetrabasic acid anhydride (WO 2010/053185, which is incorporated herein by reference in its entirety).

The poly(meth)acrylate structure is the structure formed by polymerization of acrylic acid or an acrylate ester, and also this includes the structure formed by polymerization of methacrylic acid or a methacrylate ester. The (meth)acrylate structure may be included in the main chain or in the side chain in the molecule of the stress relaxing material.

Preferable examples of the poly(meth)acrylate resin, which is the resin having an intramolecular poly(meth) acrylate structure, include a poly(meth)acrylate resin containing a hydroxy group, a poly(meth)acrylate resin containing a phenolic hydroxy group, a poly(meth)acrylate resin containing a carboxy group, a poly(meth)acrylate resin containing an acid anhydride group, a poly(meth)acrylate resin containing an epoxy group, a poly(meth)acrylate resin containing an isocyanate group, and a poly(meth)acrylate resin containing a urethane group.

Specific examples of the poly(meth)acrylate resin include Teisan Resin "SG-70L", "SG-708-6", "WS-023", "SG-700AS", "SG-280TEA" (acrylic ester copolymer resins containing a carboxy group, acid value of 5 to 34 mg KOH/g, weight-average molecular weight of 400,000 to 900,000, Tg of −30° C. to 5° C.), "SG-80H", "SG-80H-3", and "SG-P3" (acrylic ester copolymer resins containing an epoxy group, epoxy equivalent of 4761 to 14285 g/eq, weight-average molecular weight of 350,000 to 850,000, Tg of 11° C. to 12° C.), and "SG-600TEA" and "SG-790" (acrylic ester copolymer resins containing a hydroxy group; hydroxy value of 20 to 40 mg KOH/g, weight-average molecular weight of 500,000 to 1,200,000, Tg of −37° C. to −32° C.), all manufactured by Nagase ChemteX Corp.; and "ME-2000" and "W-116.3" (acrylic ester copolymer resins containing a carboxylic group), "W-197C" (acrylic ester copolymer resin containing a hydroxy group), "KG-25" and "KG-3000" (acrylic ester copolymer resins containing an epoxy group), all manufactured by Negami Chemical Industrial Co., Ltd.

It is preferable that the polyalkylene structure have a predetermined number of carbon atoms. The specific number of the carbon atom in the polyalkylene structure is preferably two or more, more preferably three or more, especially preferably 5 or more, and preferably 15 or less, more preferably 10 or less, and especially preferably 6 or less. The polyalkylene structure may be included in the main chain or in the side chain in the molecule of the stress relaxing material.

It is preferable that the polyalkyleneoxy structure have a predetermined number of carbon atoms. The specific number of the carbon atom in the polyalkyleneoxy structure is preferably two or more, preferably three or more, more preferably 5 or more, and preferably 15 or less, more preferably 10 or less, and especially preferably 6 or less. The polyalkyleneoxy structure may be included in the main chain or in the side chain in the molecule of the stress relaxing material.

Specific examples of the polyalkylene resin, which is the resin having an intramolecular polyalkylene structure, and of the polyalkyleneoxy resin, which is the resin having an intramolecular polyalkyleneoxy structure include: "PTXG-1000" and "PTXG-1800", both manufactured by Asahi Kasei Fibers Corp.; "YX-7180" manufactured by Mitsubishi Chemical Corp. (resin containing an alkylene structure having an ether bond); "EXA-4850-150", "EXA-4816", and "EXA-4822", all manufactured by DIC Corporation; "EP-4000", "EP-4003", "EP-4010", and "EP-4011", all manufactured by Adeka Corp.; "BEO-60E" and "BPO-20E", both manufactured by New Japan Chemical Co., Ltd.; and "YL7175" and "YL7410", both manufactured by Mitsubishi Chemical Corp.

The polyisoprene structure may be included in the main chain or in the side chain in the molecule of the stress relaxing material. Specific examples of the polyisoprene resin, which is the resin having an intramolecular polyisoprene structure, include "KL-610" and "KL-613", both manufactured by Kuraray Co., Ltd.

The polyisobutylene structure may be included in the main chain or in the side chain in the molecule of the stress relaxing material. Specific examples of polyisobutylene resin, which is a resin having an intramolecular polyisobutylene structure, include "SIBSTAR-073T" (styrene-isobutylene-styrene triblock copolymer) and "SIBSTAR-042D" (styrene-isobutylene diblock copolymer), both manufactured by Kaneka Corp.

The polycarbonate structure may be included in the main chain or in the side chain in the molecule of the stress relaxing material.

Preferable examples of the polycarbonate resin, which is the resin having an intramolecular polycarbonate structure, include a polycarbonate resin containing a hydroxy group, a polycarbonate resin containing a phenolic hydroxy group, a polycarbonate resin containing a carboxy group, a polycarbonate resin containing an acid anhydride group, a polycarbonate resin containing an epoxy group, a polycarbonate resin containing an isocyanete group, and a polycarbonate resin containing a urethane group.

Specific examples of the polycarbonate resin include "T6002" and "T6001" (polycarbonate diols), both manufactured by Asahi Kasei Chemicals Corp.; and "C-1090", "C-2090", and "C-3090" (polycarbonate diols), all manufactured by Kuraray Co., Ltd.

Preferable example of the polycarbonate resin may also be a linear polyimide obtained from raw materials, i.e., a hydroxy-terminated polycarbonate, a diisocyanate compound, and a polybasic acid or its anhydride. This linear polyimide has a urethane structure and a polycarbonate structure. The content of the polycarbonate structure in the polyimide resin is preferably in the range of 60 to 95% by mass, and more preferably in the range of 75 to 85% by mass. For details of the polyimide resin, see WO2016/129541, which is incorporated herein by reference in its entirety; the contents thereof being incorporated into this specification.

The number-average molecular weight of the hydroxy-terminated polycarbonate is preferably in the range of 500 to 5,000, and more preferably in the range of 1,000 to 3,000. The hydroxy equivalent of the hydroxy-terminated polycarbonate is preferably in the range of 250 to 1,250.

It is preferable that the non-particulate stress relaxing material further have an imide structure. The imide structure therein effectively enhances a heat resistance and a crack resistance of the non-particulate stress relaxing material.

The non-particulate stress relaxing material may be any of a linear, a branched, and a cyclic structure; but a linear structure is preferable.

It is preferable that the non-particulate stress relaxing material further have a functional group that is capable of reacting with the epoxy resin. The functional group includes a reactive group that appears upon heating. The mechanical strength of the cured resin composition (layer) can be enhanced when the non-particulate stress relaxing material has the functional group.

Illustrative examples of the functional group include a carboxy group, a hydroxy group, an acid anhydride group, a phenolic hydroxy group, an epoxy group, an isocyanate group, and a urethane group. In particular, from the viewpoint of clearly obtaining the advantageous effects of the present invention, it is preferable to have one or more functional groups selected from a hydroxy group, an acid anhydride group, a phenolic hydroxy group, an epoxy group, an isocyanate group, and a urethane group, in which a phenolic hydroxy group is especially preferable.

The non-particulate stress relaxing material may be used singly or as a combination of two or more of these materials.

The specific number-average molecular weight Mn of the non-particulate stress relaxing material is preferably 500 or more, more preferably 800 or more, still more preferably 1,000 or more, especially preferably 1,200 or more, and preferably 100,000 or less, more preferably 50,000 or less, and especially preferably 10,000 or less. The number-average molecular weight Mn of the non-particulate stress relaxing material is the number-average molecular weight in terms of polystyrene that is measured by means of GPC (gel permeation chromatography).

When the non-particulate stress relaxing material has the functional group, a functional group equivalent of the non-particulate stress relaxing material is preferably 100 g/eq. or more, more preferably 200 g/eq. or more, still more preferably 1,000 g/eq. or more, especially preferably 2,500 g/eq. or more, and preferably 50,000 g/eq. or less, more preferably 30,000 g/eq. or less, still more preferably 10,000 g/eq. or less, and especially preferably 5,000 g/eq. or less. The functional group equivalent is the number of grams of the resin that contains one gram equivalent of the said functional group. For example, the epoxy equivalent may be measured in according with JIS K7236. Also, for example, the hydroxy equivalent may be calculated by dividing the molecular weight of KOH by the hydroxy value measured in according with JIS K1557-1.

The glass transition temperature (Tg) of the (D) stress relaxing material is preferably 20° C. or lower, more preferably 10° C. or lower, and still more preferably 0° C. or lower.

The content of the (D) stress relaxing material in the resin composition (layer) is not particularly restricted, but the content relative to 100% by mass of the nonvolatile components in the resin composition (layer) is preferably 50% or less by mass, more preferably 30% or less by mass, still more preferably 25% or less by mass, far still more preferably 20% or less by mass, and especially preferably 15% or less by mass. The lower limit of the content of the (D) stress relaxing material in the resin composition (layer) is not particularly restricted, but the content relative to 100% by mass of the nonvolatile components in the resin composition (layer) is, from the viewpoint of further suppressing the warpage formation, preferably 0.1% or more by mass, more preferably 0.5% or more by mass, still more preferably 1% or more by mass, far still more preferably 3% or more by mass, and especially preferably 5% or more by mass.

(E) Curing Agent

The resin composition (layer) in the resin sheet according to the present invention may contain (E) a curing agent as an optional component. The (E) curing agent may be used singly or as an arbitrary combination of two or more of these agents. The (E) curing agent can have a function of curing the (A) epoxy resin by reacting with it. The (E) curing agent described herein is a component other than those belonging to the (D) stress relaxing material described above.

The (E) curing agent is not particularly restricted; illustrative examples thereof include an active ester type curing agent, a phenol type curing agent, a carbodiimide type curing agent, an acid anhydride type curing agent, an amine type curing agent, a benzoxazine type curing agent, a cyanate ester type curing agent, and a thiol type curing agent. From the viewpoint of further lowering the dielectric loss tangent, in one embodiment, the (E) curing agent includes preferably one or more curing agents selected from an active ester type curing agent and a carbodiimide type curing agents, especially preferably an active ester type curing agent.

In general, as the active ester type curing agent, a compound having two or more ester groups per one molecule with a high reactivity is preferably used, the examples thereof including a phenol ester, a thiophenol ester, an N-hydroxyamine ester, and an ester of a heterocyclic hydroxy compound. This active ester compound is preferably the one obtained by a condensation reaction of a carboxylic acid compound and/or a thiocarboxylic acid compound with a hydroxy compound and/or a thiol compound. From the viewpoint of enhancing the heat resistance, the active ester compound obtained from a carboxylic acid compound and a hydroxy compound is preferable, and the active ester compound obtained from a carboxylic acid compound and a phenol compound and/or a naphthol compound is more preferable. Illustrative examples of the carboxylic acid compound include benzoic acid, acetic acid, succinic acid, maleic acid, itaconic acid, phthalic acid, isophthalic acid, terephthalic acid, and pyromellitic acid. Illustrative examples of the phenol compound or the naphthol compound include hydroquinone, resorcin, bisphenol A, bisphenol F, bisphenol S, phenolphthalein, methylated bisphenol A, methylated bisphenol F, methylated bisphenol S, phenol, o-cresol, m-cresol, p-cresol, catechol, α-naphthol, 0-naphthol, 1,5 dihydroxynaphthalene, 1,6-dihydroxynaphthalene, 2,6-dihydroxynaphthalene, dihydroxybenzophenone, trihydroxybenzophenone, tetrahydroxybenzophenone, phloroglucin, benzenetriol, a dicyclopentadiene type diphenol compound, and phenolic novolac. Herein, “dicyclopentadiene type diphenol compound” means a diphenol compound obtained by condensation of 2 phenol molecules to 1 dicyclopentadiene molecule.

As for the active ester type curing agents, specifically, preferable are a dicyclopentadiene type active ester compound, a naphthalene type active ester compound containing a naphthalene structure, an active ester compound containing a acetylated phenolic novolac, and an active ester compound containing a benzoylated phenolic novolac; among these, more preferable is at least one compound selected from the dicyclopentadiene type active ester compound and the naphthalene type active ester compound. As for the dicyclopentadiene type active ester compound, the active ester compound containing a dicyclopentadiene type diphenol structure is preferable.

Illustrative examples of the commercially available active ester type curing agent include: as the active ester compound containing the dicyclopentadiene type diphenol structure, “EXB9451”, “EXB9460”, “EXB9460S”, “HPC-8000L-65TM”, “HPC-8000-65T”, “HPC-8000H”, and “HPC-8000H-65TM” (all manufactured by DIC Corporation); as the active ester compound containing the naphthalene structure, “HP—B-8151-62T”, “EXB-8100L-65T”, “EXB-9416-70BK”, “HPC-8150-62T”, and “EXB-8” (all manufactured by DIC Corporation); as the active ester compound containing phosphorus, “EXB9401” (manufactured by DIC Corporation); as the active ester compound that is an acetylated phenol novolac, “DC808” (manufactured by Mitsubishi Chemical Corp.); as the active ester compounds that is a benzoylated phenol novolac, “YLH1026”, “YLH1030”, and “YLH1048” (all manufactured by Mitsubishi Chemical Corp.); and as the active ester compound containing a styryl group and a naphthalene structure, “PC1300-02-65MA” (manufactured by Air Water Inc.).

As for the phenol type curing agent, a phenol type curing agent having a novolac structure is preferable from the viewpoint of a heat resistance and a moisture resistance. From the viewpoint of adhesion to an adherend, a phenol type curing agent containing a nitrogen atom is preferable, and a phenol type curing agent containing a triazine backbone is more preferable. Among them, the phenol type novolac resin containing a triazine backbone is preferable from the viewpoint of highly satisfying the heat resistance, the moisture resistance, and the adhesion. Specific examples of the phenol type curing agent include: “MEH-7700”, “MEH-7810”, and “MEH-7851”, all manufactured by Meiwa Kasei Industries Ltd.; “NHN”, “CBN”, and “GPH”, all manufactured by Nippon Kayaku Co., Ltd.; “SN-170”, “SN-180”, “SN-190”, “SN-475”, “SN-485”, “SN-495”, “SN-375”, and “SN-395”, all manufactured by NIPPON STEEL Chemical & Material Co., Ltd.; and “LA-7052”, “LA-7054”, “LA-3018”, “LA-3018-50P”, “LA-1356”, “TD2090”, and “KA-1160”, all manufactured by DIC Corporation.

As for the carbodiimide type curing agent, a curing agent having one or more carbodiimide structures, preferably two or more, in one molecule may be cited, in which illustrative examples thereof include: aliphatic biscarbodiimides such as tetramethylene-bis(t-butylcarbodiimide) and cyclohexane-bis(methylene-t-butylcarbodiimide); aromatic biscarbodiimides such as phenylene-bis(xylenecarbodiimide); aliphatic polycarbodiimides such as polyhexamethylene carbodiimide, polycyclohexylene carbodiimide, poly(methylenebiscyclohexylene carbodiimide), and poly(isophorone carbodiimide); and aromatic polycarbodiimides such as poly(phenylene)carbodiimide, poly(naphthylene)carbodiimide, poly(tolylenecarbodiimide), Poly(methyldiisopropylphenylene carbodiimide), poly(triethylphenylene carbodiimide), poly(diethylphenylene carbodiimide), poly(triisopropylphenylene carbodiimide), poly(diisopropylphenylene carbodiimide), poly(xylylene carbodiimide), poly(tetramethylxylylene carbodiimide), poly(methylenediphenylene carbodiimide), and poly[methylenebis(methylphenylene) carbodiimide].

Illustrative examples of the commercially available carbodiimide type curing agent include: “Carbodilite V-02B”, “Carbodilite V-03”, “Carbodilite V-04K”, “Carbodilite V-07”, and “Carbodilite V-09”, all manufactured by Nisshinbo Chemical Inc.; and “Stabaxol P”, “Stabaxol P400”, and “Hycadyl 510”, all manufactured by Rhein Chemie GmbH.

As for the acid anhydride type curing agent, the curing agent having one or more acid anhydride groups in one molecule may be cited, in which the curing agent having two or more acid anhydride groups in one molecule is preferable. Specific examples of the acid anhydride type curing agent include phthalic anhydride, tetrahydrophthalic anhydride, hexahydrophthalic anhydride, methyltetrahydrophthalic anhydride, methylhexahydrophthalic anhydride, methylnadic anhydride, hydrogenated methylnadic anhydride, trialkyltetrahydrophthalic anhydride, dodecenylsuccinic anhydride, 5-(2,5-dioxotetrahydro-3-furanyl)-3-methyl-3-cyclohexene-1,2-dicarboxylic anhydride, trimellitic anhydride, pyromellitic anhydride, benzophenonetetracarboxylic dianhydride, biphenyltetracarboxylic dianhydride, naphthalenetetracarboxylic dianhydride, oxydiphthalic dianhydride, 3,3'-4,4'-diphenylsulfonetetracarboxylic anhydride, 1,3,3a,4,5,9b-hexahydro-5-(tetrahydro-2,5-dioxo-3-furanyl)-naphtho[1,2-C]-furan-1,3-dione, ethyleneglycol bis (anhydrotrimellitate), and polymer type acid anhydrides such as styrene-maleic acid resin that is obtained by copolymerization of styrene and maleic acid. Illustrative examples of the commercially available acid anhydride type curing agent include: “HNA-100”, “MH-700”, “MTA-15”, “DDSA”, and “OSA”, all manufactured by New Japan Chemical Co., Ltd.; “YH-306” and “YH-307”, both manufactured by Mitsubishi Chemical Corp.; “HN-2200” and “HN-5500”, both manufactured by Hitachi Chemical Co., Ltd.; and “EF-30”, “EF-40”, “EF-60”, and EF-80”, all manufactured by Cray Valley SA.

As for the amine type curing agent, the curing agent having one or more amino groups, preferably two or more amino groups in one molecule may be cited, and illustrative examples thereof include an aliphatic amine, a polyether amine, an alicyclic amine, and an aromatic amine; among them, from the viewpoint of achieving the desired advantageous effects of the invention, an aromatic amine is preferable. As for the amine type curing agent, a primary amine or a secondary amine is preferable; a primary amine is more preferable. Specific examples of the amine type curing agent include 4,4'-methylenebis(2,6-dimethylaniline), 4,4'-diaminodiphenylmethane, 4,4'-diaminodiphenylsulfone, 3,3'-diaminodiphenylsulfone, m-phenylenediamine, m-xylylenediamine, diethyltoluenediamine, 4,4'-diaminodiphenyl ether, 3,3'-dimethyl-4,4'-diaminobiphenyl, 2,2'-dimethyl-4,4'-diaminobiphenyl, 3,3'-dihydroxybenzidine, 2,2-bis(3-amino-4-hydroxyphenyl)propane, 3,3-dimethyl-5,5-diethyl-4,4-diphenylmethanediamine, 2,2-bis(4-aminophenyl) propane, 2,2-bis (4-(4-aminophenoxy)phenyl)propane, 1,3-bis (3-aminophenoxy)benzene, 1,3-bis(4-aminophenoxy) benzene, 1,4-bis(4-aminophenoxy)benzene, 4,4'-bis(4-aminophenoxy)biphenyl, bis(4-(4-aminophenoxy)phenyl) sulfone, and bis(4-(3-aminophenoxy)phenyl)sulfone. A commercially available amine type curing agent may be used, in which illustrative examples thereof include: “SEIKACURE-S” manufactured by Seika Corp.; “KAYABOND C-200S”, “KAYABOND C-100”, “KAYAHARD A-A”, “KAYAHARD A-B”, and “KAYAHARD A-S”, all manufactured by Nippon Kayaku Co., Ltd.; and “Epicure W” manufactured by Mitsubishi Chemical Corp.

Specific examples of the benzoxazine type curing agent include “JBZ-OP100D” and “ODA-BOZ”, both manufactured by JFE Chemical Corp.; “HFB2006M” manufactured by Showa High Polymer Co., Ltd.; and “P-d” and “F-a”, both manufactured by Shikoku Chemicals Corp.

Illustrative examples of the cyanate ester type curing agent include: bifunctional cyanate resins such as bisphenol A dicyanate, polyphenol cyanate(oligo(3-methylene-1,5-phenylenecyanate)), 4,4'-methylenebis(2,6-dimethylphenylcyanate), 4,4'-ethylidene diphenyl dicyanate, hexafluorobisphenol A dicyanate, 2,2-bis(4-cyanate)phenylpropane, 1,1-bis(4-cyanatephenyl)methane, bis(4-cyanate-3,5-dimethylphenyl)methane, 1,3-bis(4-cyanatephenyl-1-(methylethylidene))benzene, bis(4-cyanatephenyl) thioether, and bis(4-cyanatephenyl) ether; multifunctional cyanate resins derived from a phenol novolac and a cresol novolac; and prepolymers in which these cyanate resins are partially triazinated. Specific examples of the cyanate ester type curing agent include "PT30" and "PT60" (both phenol novolac type multifunctional cyanate ester resins), as well as "BA230" and "BA230S75" (prepolymers in which a part or all of the bisphenol A dicyanate is triazinated to form a trimer), all manufactured by Lonza Japan Ltd.

Illustrative examples of the thiol type curing agent include trimethylolpropane tris(3-mercaptopropionate), pentaerythritol tetrakis(3-mercaptobutyrate), and tris(3-mercaptopropyl)isocyanurate.

The reactive group equivalent of the (E) curing agent is preferably in the range of 50 g/eq to 3000 g/eq., more preferably in the range of 100 g/eq to 1000 g/eq., still more preferably in the range of 100 g/eq to 500 g/eq., and especially preferably in the range of 100 g/eq to 300 g/eq. The reactive group equivalent is the mass of the (E) curing agent per one equivalent of the reactive group.

The content of the (E) curing agent in the resin composition (layer) is not particularly restricted, but the content is preferably 30% or less by mass, more preferably 20% or less by mass, still more preferably 10% or less by mass, and especially preferably 5% or less by mass, relative to 100% by mass of the nonvolatile components in the resin composition (layer). The lower limit of the content of the (E) curing agent in the resin composition (layer) is not particularly restricted, but this can be, for example, 0% or more by mass, 0.01% or more by mass, preferably 0.1% or more by mass, more preferably 1% or more by mass, and especially preferably 3% or more by mass, relative to 100% by mass of the nonvolatile components in the resin composition (layer).

(F) Curing Accelerator

The resin composition in the resin sheet according to the present invention may further contain (F) a curing accelerator as an optional component. The (F) curing accelerator has a function to accelerate the curing of the (B) epoxy resin as a curing catalyst.

Illustrative examples of the (F) curing accelerator include a phosphorus type curing accelerator, a urea type curing accelerator, a guanidine type curing accelerator, an imidazole type curing accelerator, a metal type curing accelerator, and an amine type cure accelerator. It is preferable that the (F) curing accelerator include a curing accelerator selected from an imidazole type curing accelerator and an amine type curing accelerator. The (F) curing accelerator may be used singly or as a combination of two or more of these accelerators.

Illustrative examples of the phosphorus type curing accelerator include: aliphatic phosphonium salts such as tetrabutylphosphonium bromide, tetrabutylphosphonium chloride, tetrabutylphosphonium acetate, tetrabutylphosphonium decanoate, tetrabutylphosphonium laurate, bis(tetrabutylphosphonium) pyromellitate, tetrabutylphosphonium hydrogen hexahydrophthalate, tetrabutylphosphonium 2,6-bis[(2-hydroxy-5-methylphenyl)methyl]-4-methylphenolate, and di-tert-butylmethylphosphonium tetraphenylborate; aromatic phosphonium salts such as methyltriphenylphosphonium bromide, ethyltriphenylphosphonium bromide, propyltriphenylphosphonium bromide, butyltriphenylphosphonium bromide, benzyltriphenylphosphonium chloride, tetraphenylphosphonium bromide, p-tolyltriphenylphosphonium tetra-p-tolylborate, tetraphenylphosphonium tetraphenylborate, tetraphenylphosphonium tetra-p-tolylborate, triphenylethylphosphonium tetraphenylborate, tris(3-methylphenyl)ethylphosphonium tetraphenylborate, tris(2-methoxyphenyl)ethylphosphonium tetraphenylborate, (4-methylphenyl)triphenylphosphonium thiocyanate, tetraphenylphosphonium thiocyanate, and butyltriphenylphosphonium thiocyanate; aromatic phosphine-borane complexes such as triphenylphosphine triphenylborane; aromatic phosphine-quinone addition products such as triphenylphosphine·p-benzoquinone addition product; aliphatic phosphines such as tributyl phosphine, tri-tert-butyl phosphine, trioctyl phosphine, di-tert-butyl(2-butenyl) phosphine, di-tert-butyl(3-methyl-2-butenyl) phosphine, and tricyclohexyl phosphine; aromatic phosphines such as dibutylphenyl phosphine, di-tert-butylphenyl phosphine, methyldiphenyl phosphine, ethyldiphenyl phosphine, butyldiphenyl phosphine, diphenylcyclohexyl phosphine, triphenyl phosphine, tri-o-tolyl phosphine, tri-m-tolyl phosphine, tri-p-tolyl phosphine, tris(4-ethylphenyl) phosphine, tris(4-propylphenyl) phosphine, tris(4-isopropylphenyl) phosphine, tris(4-butylphenyl) phosphine, tris(4-tert-butylphenyl) phosphine, tris(2,4-dimethylphenyl) phosphine, tris(2,5-dimethylphenyl) phosphine, tris(2,6-dimethylphenyl) phosphine, tris(3,5-dimethylphenyl) phosphine, tris(2,4,6-trimethylphenyl) phosphine, tris(2,6-dimethyl-4-ethoxyphenyl) phosphine, tris(2-methoxyphenyl) phosphine, tris(4-methoxyphenyl) phosphine, tris(4-ethoxyphenyl) phosphine, tris(4-tert-butoxyphenyl) phosphine, diphenyl-2-pyridyl phosphine, 1,2-bis(diphenylphosphino)ethane, 1,3-bis(diphenylphosphino)propane, 1,4-bis(diphenylphosphino)butane, 1,2-bis(diphenylphosphino)acetylene, and 2,2'-bis(diphenylphosphino)diphenyl ether.

Illustrative examples of the urea type curing accelerator include: aliphatic dimethylureas such as 1,1-dimethylurea, 1,1,3-trimethylurea, 3-ethyl-1,1-dimethylurea, 3-cyclohexyl-1,1-dimethylurea, and 3-cyclooctyl-1,1-dimethylurea; aromatic dimethylurea such as 3-phenyl-1,1-dimethylurea, 3-(4-chlorophenyl)-1,1-dimethylurea, 3-(3,4-dichlorophenyl)-1,1-dimethylurea, 3-(3-chloro-4-methylphenyl)-1,1-dimethylurea, 3-(2-methylphenyl)-1,1-dimethylurea, 3-(4-methylphenyl)-1,1-dimethylurea, 3-(3,4-dimethylphenyl)-1,1-dimethylurea, 3-(4-isopropylhenyl)-1,1-dimethylurea, 3-(4-methoxyphenyl)-1,1-dimethylurea, 3-(4-nitrophenyl)-1,1-dimethylurea, 3-[4-(4-methoxyphenoxy)phenyl]-1,1-dimethylurea, 3-[4-(4-chlorophenoxy)phenyl-1,1-dimethylurea, 3-[3-(trifluoromethyl)phenyl]-1,1-dimethyl urea, N,N-(1,4-phenylene)bis(N',N'-dimethylurea), and N,N-(4-methyl-1,3-phenylene)bis(N',N'-dimethylurea) [toluene bisdimethylurea].

Illustrative examples of the guanidine type curing accelerator include dicyandiamide, 1-methylguanidine, 1-ethylguanidine, 1-cyclohexylguanidine, 1-phenylguanidine, 1-(o-tolyl)guanidine, dimethylguanidine, diphenylguanidine, trimethylguanidine, tetramethylguanidine, pentamethylguanidine, 1,5,7-triazabicyclo[4.4.0]deca-5-ene, 7-methyl-1,5,7-triazabicyclo[4.4.0]deca-5-ene, 1-methylbiguanide, 1-ethylbiguanide, 1-n-butylbiguanide, 1-n-octadecylbiguanide, 1,1-dimethylbiguanide, 1,1-diethylbiguanide, 1-cyclohexylbiguanide, 1-allylbiguanide, 1-phenylbiguanide, and 1-(o-tolyl)biguanide.

Illustrative examples of the imidazole type curing accelerator include imidazole compounds such as 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, 2,4-diamino-6-[2'-methylimidazolyl- (1')]-ethyl-s-triazine, 2,4-diamidino-6-[2'-undecylimidazolyl-(1')]-ethyl-s-triazine, 2,4-diamidino-6-[2'-ethyl-4'-methylimidazolyl-(1')]-ethyl-s-triazine, 2,4-diamidino-6-[2'-methylimidazolyl-(1')]-ethyl-s-triazine isocyanurate adduct, 2-phenylimidazole isocyanurate adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, 2-phenylimidazoline, as well as adducts of these imidazole compounds with an epoxy resin.

As for the imidazole type curing accelerator, a commercially available product may be used, such as “1B2PZ”, “2MZA-PW”, “2PHZ—PW”, and “C11Z-A”, all manufactured by Shikoku Chemicals Corp., as well as “P200-H50” manufactured by Mitsubishi Chemical Corp.

As for the metal type curing accelerator, for example, organometallic complexes or organometallic salts of the metals such as cobalt, copper, zinc, iron, nickel, manganese, and tin may be cited. Specific examples of the organometallic complex include: organocobalt complexes such as cobalt(II) acetylacetonate and cobalt(III) acetylacetonate; organocopper complexes such as copper(II) acetylacetonate; organozinc complexes such as zinc(II) acetylacetonate; organoiron complexes such as iron(III) acetylacetonate; organonickel complexes such as nickel(II) acetylacetonate; and organomanganese complexes such as manganese(II) acetylacetonate. As for the organometallic salt, for example, zinc octylate, tin octylate, zinc naphthenate, cobalt naphthenate, tin stearate, and zinc stearate may be cited.

As for the amine type curing accelerator, for example, trialkylamines such as triethylamine and tributylamine, as well as 4-dimethylaminopyridine, benzyl dimethylamine, 2,4,6-tris(dimethylaminomethyl)phenol, and 1,8-diazabicyclo(5,4,0)-undecene may be cited.

As for the amine type curing accelerator, commercially available products such as “MY-25” manufactured by Ajinomoto Fine-Techno Co., Inc. may be cited.

The content of the (F) curing accelerator in the resin composition (layer) is not particularly restricted, but the content is preferably 5% or less by mass, more preferably 1% or less by mass, still more preferably 0.5% or less by mass, and especially preferably 0.1% or less by mass, relative to 100% by mass of the nonvolatile components in the resin composition (layer). The lower limit of the content of the (F) curing accelerator in the resin composition (layer) is not particularly restricted, but this can be, for example, 0% or more by mass, 0.001% or more by mass, 0.01% or more by mass, or 0.05% or more by mass, relative to 100% by mass of the nonvolatile components in the resin composition (layer).

(G) Radical Polymerizable Compound

The resin composition (layer) in the resin sheet according to the present invention may contain (G) a radical polymerizable compound as an optional component. The (G) radical polymerizable compound may be used singly or as an arbitrary combination of two or more of these compounds. The (G) radical polymerizable compound described here is a component other than those belonging to the (A) epoxy resin, the (D) stress relaxing material, and the (E) curing agent described above.

The (G) radical polymerizable compound is, in one embodiment, a radical polymerizable compound having an ethylenic unsaturated bond. The (G) radical polymerizable compound is not particularly restricted, but this can have a radical polymerizable group, for example, an unsaturated hydrocarbon group such as an allyl group, a 3-cyclohexenyl group, a 3-cyclopentenyl group, a 2-vinylphenyl group, a 3-vinylphenyl group, or a 4-vinylphenyl group; and an α,β-unsaturated carbonyl group such as an acryloyl group, a methacryloyl group, or a maleimide group (2,5-dihydro-2,5-dioxo-1H-pyrrol-1-yl group). In one embodiment, it is preferable that the (G) radical polymerizable compound have a maleimide group. In one embodiment, it is preferable that the (G) radical polymerizable compound have two or more radical polymerizable groups.

In a first embodiment, it is preferable that the (G) radical polymerizable compound include a maleimide compound represented by the formula (G-1).

(G-1)

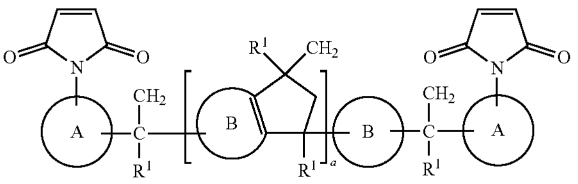

In the formula, $R^1$'s each independently represent an alkyl group; the ring A and the ring B each independently represent an optionally substituted aromatic ring; and a represents an integer of 1 or more. A unit may be the same or different in each structural unit. The maleimide compound in the first embodiment may be used singly or as a combination of two or more of these compounds at any mixing ratio.

In this specification, the substituent group is not particularly restricted; so, illustrative examples thereof include monovalent substituent groups such as an alkyl group, an alkenyl group, an aryl group, an aryl-alkyl group (an alkyl group substituted by an aryl group), an alkyl-aryl group (an aryl group substituted by an alkyl group), an alkyl-oxy group, an alkenyl-oxy group, an aryl-oxy group, an alkyl-carbonyl group, an alkenyl-carbonyl group, an aryl-carbonyl group, an alkyl-oxy-carbonyl group, an alkenyl-oxy-carbonyl group, an aryl-oxy-carbonyl group, an alkyl-carbonyl-oxy group, an alkenyl-carbonyl-oxy group, an aryl-carbonyl-oxy group, as well as if substitutable, divalent substituent groups such as an oxo group (=O).

The alkyl (group) means a linear, a branched and/or a cyclic monovalent aliphatic saturated hydrocarbon group. The alkyl (group) is preferably an alkyl (group) having 1 to 14 carbon atoms, more preferably 1 to 10 carbon atoms, and still more preferably 1 to 6 carbon atoms, unless otherwise specifically noted. Illustrative examples of the alkyl (group) include a methyl group, an ethyl group, a propyl group, an isopropyl group, a butyl group, an isobutyl group, a sec-butyl group, a tert-butyl group, a pentyl group, a hexyl group, a heptyl group, an octyl group, a nonyl group, a decyl group, a cyclopentyl group, a cyclohexyl group, a methylcyclohexyl group, a dimethylcyclohexyl group, a trimethylcyclohexyl group, a cyclopentylmethyl group, and a cyclohexylmethyl group. The alkenyl (group) means a linear, a branched and/or a cyclic monovalent aliphatic unsaturated hydrocarbon group having at least one carbon-carbon double bond. The alkenyl (group) is preferably an alkenyl group having 2 to 14 carbon atoms, more preferably 2 to 10 carbon atoms, and still more preferably 2 to 6 carbon atoms, unless otherwise specifically noted. Illustrative examples of the alkenyl (group) include a vinyl group, a propenyl group, a butenyl group, a pentenyl group, a hexenyl group, a heptenyl group, an octenyl group, a nonenyl group, a decenyl group, and a cyclohexenyl group. The aryl (group) means a monovalent aromatic hydrocarbon group having 1 hydrogen atom removed in the aromatic carbon ring. The aryl (group) is preferably an aryl (group) having 6 to 14 carbon atoms, and especially preferably 6 to 10 carbon atoms, unless otherwise specifically noted. Illustrative examples of the aryl (group) include a phenyl group, a 1-naphthyl group, and a 2-naphthyl group.

Each $R^1$ independently represents an alkyl group, in which in one embodiment a methyl group is preferable. The rings A each independently represent an optionally substituted aromatic ring, and in one embodiment, this is preferably an optionally substituted benzene ring, more preferably a benzene ring optionally substituted by a group selected from an alkyl group, and still more preferably a benzene ring substituted by a group selected from an alkyl group. The rings B each independently represent an optionally substituted aromatic ring, and in one embodiment, this is preferably an optionally substituted benzene ring, more preferably a benzene ring optionally substituted by a group selected from an alkyl group, and still more preferably an (unsubstituted) benzene ring. The alphabetical letter a represents an integer of 1 or more, preferably an integer of 1 to 20.

The (G) radical polymerizable compound in the first embodiment can be produced, for example, by using the method described in the Public Technical Report No. 2020-500211, Journal of Technical Disclosure, Japan Institute for Promoting Invention and Innovation, or a method equivalent thereto.

In a second embodiment, the (G) radical polymerizable compound includes preferably the maleimide compound having a substructure represented by the formula (G-2').

(G-2')

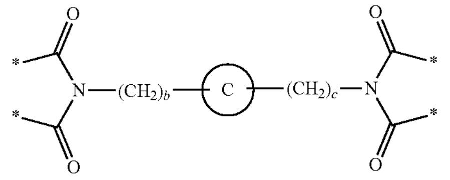

In the formula, the ring C represents an optionally substituted monocycloalkane ring, or an optionally substituted monocycloalkene ring; b and c each independently represent an integer of 0, or one or more, in which the sum of b and c is 6 or more; and * indicates a bonding site. The maleimide compound according to the second embodiment may be used singly or as a combination of two or more of these compounds at any mixing ratio.

The monocycloalkane ring means a monocyclic aliphatic saturated hydrocarbon ring. As for the monocycloalkane ring, a monocycloalkane ring having 4 to 14 carbon atoms is preferable, a monocycloalkane ring having 4 to 10 carbon atoms is more preferable, a monocycloalkane ring having 5 or 6 carbon atoms is especially preferable. Illustrative examples of the monocycloalkane ring include a cyclobutane ring, a cyclopentane ring, a cyclohexane ring, a cycloheptane ring, and a cyclooctane ring. The monocycloalkenylene ring means a monocyclic aliphatic unsaturated hydrocarbon ring having at least one carbon-carbon double bond. As for the monocycloalkene ring, a monocycloalkene ring having 4 to 14 carbon atoms is preferable, a monocycloalkene ring having 4 to 10 carbon atoms is more preferable, and a monocycloalkene ring having or 6 carbon atoms is especially preferable. Illustrative examples of the monocycloalkene ring include a cyclobutene ring, a cyclopentene ring, a cyclohexene ring, a cycloheptene ring, a cyclooctene ring, a cyclopentadiene ring, and a cyclohexadiene ring.

The ring C represents an optionally substituted monocycloalkane ring, or an optionally substituted monocycloalkene ring. The Ring C is preferably a monocycloalkane ring optionally substituted with a group selected from an alkyl group and an alkenyl group; or a monocycloalkene ring optionally substituted with a group selected from an alkyl group and an alkenyl group. The ring C is more preferably a monocycloalkane ring optionally substituted with a group selected from an alkyl group having 1 to 14 carbon atoms and an alkenyl group having 2 to 14 carbon atoms; or a monocycloalkene ring optionally substituted with a group selected from an alkyl group having 1 to 14 carbon atoms and an alkenyl group having 2 to 14 carbon atoms.

The alphabetical letters b and c each independently represent an integer of 0, or one or more, and the sum of b and c is 6 or more (preferably 8 or more, more preferably or more). Preferably, the alphabetical letters b and c each independently represent an integer of 0 to 20, and the sum of b and c is 6 or more (preferably 8 or more, more preferably 10 or more). More preferably, the alphabetical letters b and c each independently represent an integer of 1 to 20, and the sum of b and c of 6 or more (preferably 8 or more, more preferably 10 or more). Still more preferably, the alphabetical letters b and c each independently represent an integer of 5 to 10. Especially preferably, the alphabetical letters b and c are 8.

In the second embodiment, the (G) radical polymerizable compound includes especially preferably the maleimide compound represented by the formula (G-2).

(G-2)

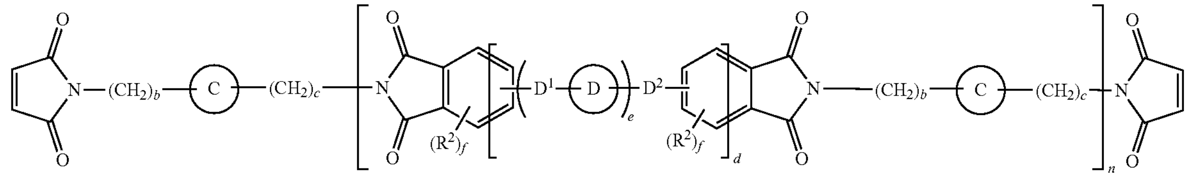

In the formula, R's each independently represent a substituent group; the rings D each independently represent an optionally substituted aromatic ring; $D^1$ and $D^2$ each independently represent a single bond, $—C(R^x)_2—$, —O—, —CO—, —S—, —SO—, $—SO_2—$, —CONH—, —NHCO—, —COO—, or —OCO—; $R^x$'s each independently represent a hydrogen atom or an alkyl group; d's each independently represent 0 or 1; e's each independently represent 0 or an integer of 1 or more; f's each independently represent 0, 1, or 2; n represents 0 or an integer of 1 or more;

and other symbols are the same as above. The e unit, the f unit, and the n unit may be the same or different in each unit.

$R^2$'s each independently represent a substituent group, preferably an alkyl group. Rings D each independently represent an optionally substituted aromatic ring, preferably a benzene ring optionally substituted with a group selected from alkyl groups. $D^1$ and $D^2$ each independently represent a single bond, —$C(R^x)_2$—, —O—, —CO—, —S—, —SO—, —$SO_2$—, —CONH—, —NHCO—, —COO—, or —OCO—, and preferably represent a single bond, —$C(R^x)_2$—, or —O—. $R^x$'s each independently represent a hydrogen atom or an alkyl group, preferably a hydrogen atom or a methyl group. The alphabetical letters d each independently represent 0 or 1, preferably 0. The alphabetical letters e each independently represent 0 or an integer of 1 or more, preferably 0, 1, 2, or 3, and more preferably 0, 1, or 2. The alphabetical letters f each independently represent 0, 1, or 2, and preferably 0. The alphabetical letter n represents 0, or an integer of 1 or more, and preferably 0.

The substructure represented by the formula (D) in the formula (G-2) is not particularly restricted, but this may be the substructures represented by the formulas (D-1) to (D-3).

(D)

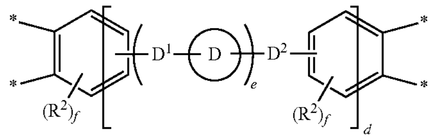

In these formulae, * represents a bonding site, and all the other symbols are the same as those described above.

(D-1)

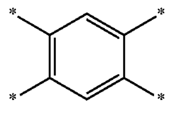

(D-2)

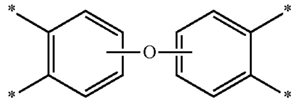

(D-3)

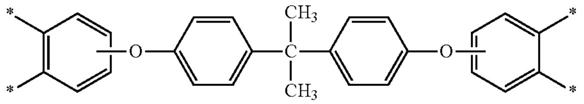

In these formulas, * represents the same as above.

Illustrative examples of the commercially available (G) radical polymerizable compound in the second embodiment include "BMI-689", "BMI-1500", "BMI-1700", and "BMI-3000J", all manufactured by Designer Molecules, Inc.

The (G) radical polymerizable compound may contain singly either of the preferable maleimide compound included in the first embodiment or the preferable maleimide compound included in the second embodiment, or a combination of two or more of them at any mixing ratio.

The radical polymerizable equivalent of the (G) radical polymerizable compound is preferably in the range of 250 g/eq to 2500 g/eq., and more preferably in the range of 300 g/eq to 1500 g/eq. The radical polymerizable equivalent of the (G) radical polymerizable compound is the mass of the resin per one equivalent of the radical polymerizable group.

The weight-average molecular weight (Mw) of the (G) radical polymerizable compound is preferably in the range of 300 to 40000, more preferably in the range of 300 to 10000, and especially preferably in the range of 300 to 7000. The weight-average molecular weight (Mw) of the resin can be measured by a gel permeation chromatography (GPC) method in terms of the standard polystyrene.

The content of the (G) radical polymerizable compound in the resin composition (layer) is not particularly restricted, but the content relative to 100% by mass of the nonvolatile components in the resin composition (layer) is preferably 50% or less by mass, more preferably 40% or less by mass, still more preferably 30% or less by mass, far still more preferably 20% or less by mass, and especially preferably 10% or less by mass. The lower limit of the content of the (G) radical polymerizable compound in the resin composition (layer) is not particularly restricted, but this is, for example, 0% or more by mass, preferably 0.01% or more by mass, more preferably 0.1% or more by mass, still more preferably 1% or more by mass, and especially preferably 2% or more by mass, relative to 100% by mass of the nonvolatile components in the resin composition (layer).

(H) Thermoplastic Resin

The resin composition in the resin sheet according to the present invention may further contain (H) a thermoplastic resin as an optional component. The (H) thermoplastic resin described herein is a component other than those belonging to the (A) epoxy resin, the (D) stress relaxing material, the (E) curing agent, and the (G) radical polymerizable compound described above.

Illustrative examples of the (H) thermoplastic resin include a polyimide resin, a phenoxy resin, a polyvinyl acetal resin, a polyolefin resin, a polybutadiene, a polyamide imide resin, a polyether imide resin, a polysulfone resin, a polyether sulfone resin, a polyphenylene ether resin, a polycarbonate resin, a polyether ether ketone resin, and a polyester resin. In one embodiment, the (H) thermoplastic resin preferably includes a thermoplastic resin selected from the group consisting of a polyimide resin and a phenoxy resin, and it is more preferable to include a phenoxy resin. The thermoplastic resin may be used singly or as a combination of two or more of these resins.

Specific examples of the polyimide resin include "SLK-6100" manufactured by Shin-Etsu Chemical Co., Ltd., as well as "Rikacoat SN20" and "Rikacoat PN20", both manufactured by New Japan Chemical Co., Ltd.

Illustrative examples of the phenoxy resin include phenoxy resins having one or more backbone selected from the group consisting of a bisphenol A backbone, a bisphenol F backbone, a bisphenol S backbone, a bisphenol acetophenone backbone, a novolac backbone, a biphenyl backbone, a fluorene backbone, a dicyclopentadiene backbone, a norbornene backbone, a naphthalene backbone, an anthracene backbone, an adamantane backbone, a terpene backbone, and a trimethylcyclohexane backbone. The phenoxy resin can be terminated with any functional group, such as a phenolic hydroxy group or an epoxy group.

Specific examples of the phenoxy resin include: "1256" and "4250" (phenoxy resins containing a bisphenol A backbone) manufactured by Mitsubishi Chemical Corp.; "YX8100" (phenoxy resin containing a bisphenol S backbone) manufactured by Mitsubishi Chemical Corp.; "YX6954" ((phenoxy resin containing a bisphenol acetophenone backbone) manufactured by Mitsubishi Chemical Corp.; "FX280" and "FX293", both manufactured by NIP- PON STEEL Chemical & Material Co., Ltd.; and "YX7200B35", "YL7500BH30", "YX6954BH30", "YX7553BH30", "YL7769BH30", "YL6794", "YL7213", "YL7290", and "YL7482", all manufactured by Mitsubishi Chemical Corp.

Examples of the polyvinyl acetal resin include a polyvinylformal resin and a polyvinyl butyral resin, in which a polyvinyl butyral resin is preferable. Specific examples of the polyvinyl acetal resin include "Denka Butyral 4000-2", "Denka Butyral 5000-A", "Denka Butyral 6000-C", and "Denka Butyral 6000-EP", all manufactured by Denka Co., Ltd.; and the S-LEC BH series, BX series (e.g., BX-5Z), KS series (e.g., KS-1), BL series, and BM series, all manufactured by Sekisui Chemical Co., Ltd.

Illustrative examples of the polyolefin resin include: low-density polyethylene, ultra-low-density polyethylene, and high-density polyethylene; ethylene copolymers such as ethylene-vinyl acetate copolymer, ethylene-ethyl acrylate copolymer, ethylene-methyl acrylate copolymer; and polyolefin polymers such as polypropylene, and ethylene-propylene block copolymer.

Illustrative examples of the polybutadiene resin include a polybutadiene resin containing a hydrogenated polybutadiene backbone, a polybutadiene resin containing a hydroxy group, a polybutadiene resin containing a phenolic hydroxy group, a polybutadiene resin containing a carboxy group, a polybutadiene resin containing an acid anhydride group, a polybutadiene resin containing an epoxy group, a polybutadiene resin containing an isocyanate group, a polybutadiene resin containing a urethane group, and a polyphenylene ether-polybutadiene resin.

Specific examples of the polyamide imide resin include "VYLOMAX HR11NN" and "VYLOMAX HR16NN", both manufactured by Toyobo Co., Ltd. Specific examples of polyamide imide resin also include modified polyamide imides such as "KS9100" and "KS9300" (polyamide imides containing a polysiloxane backbone), both manufactured by Hitachi Chemical Co., Ltd.

Specific examples of the polyether sulfone resin include "PES5003P" manufactured by Sumitomo Chemical Co., Ltd.

Specific examples of the polysulfone resin include polysulfone "P1700" and "P3500", both manufactured by Solvay Advanced Polymers LLC.

Specific examples of the polyphenylene ether resin include "NORYL SA90" manufactured by Saudi Basic Industries Corp. (SABIC). Specific examples of the polyether imide resin include "Ultem" manufactured by GE Company.

Illustrative examples of the polycarbonate resin include a carbonate resin containing a hydroxy group, a carbonate resin containing a phenolic hydroxy group, a carbonate resin containing a carboxy group, a carbonate resin containing an acid anhydride group, a carbonate resin containing an isocyanate group, and a carbonate resin containing a urethane group. Specific examples of the polycarbonate resin include "FPC0220" manufactured by Mitsubishi Gas Chemical Co., Inc.; "T6002" and "T6001" (polycarbonate diols), both manufactured by Asahi Kasei Chemicals Corp.; and "C-1090", "C-2090", and "C-3090" (polycarbonate diols), all manufactured by Kuraray Co., Ltd. Specific examples of the polyether ether ketone resin include "Sumiploy K" manufactured by Sumitomo Chemical Co., Ltd.

Illustrative examples of the polyester resin include a polyethylene terephthalate resin, a polyethylene naphthalate resin, a polybutylene terephthalate resin, a polybutylene naphthalate resin, a polytrimethylene terephthalate resin, a polytrimethylene naphthalate resin, and a polycyclohexanedimethyl terephthalate resin.

From the viewpoint of clearly obtaining the advantageous effects of the present invention, the weight-average molecular weight (Mw) of the (H) thermoplastic resin is preferably 5,000 or more, more preferably 8,000 or more, still more preferably 10,000 or more, especially 20,000 or more, and preferably 100,000 or less, more preferably 70,000 or less, still more preferably 60,000 or less, and especially preferably 50,000 or less.

The content of the (H) thermoplastic resin in the resin composition (layer) is not particularly restricted, but from the viewpoint of clearly obtaining the advantageous effects of the present invention, the content is preferably 20% or less by mass, more preferably 10% or less by mass, still more preferably 5% or less by mass, far still more preferably 3% or less by mass, and especially preferably 2% or less by mass, relative to 100% by mass of the nonvolatile components in the resin composition (layer). The lower limit of the content of the (H) thermoplastic resin in the resin composition (layer) is not particularly restricted, but this can be, for example, 0% or more by mass, 0.01% or more by mass, 0.1% or more by mass, 0.5% or more by mass, or 1% or more by mass, relative to 100% by mass of the nonvolatile components in the resin composition (layer).

(I) Other Additive

The resin composition according to the present invention may further contain an arbitrary additive. Illustrative examples of the additive like this include: radical polymerization initiators such as a peroxide type radical polymerization initiator and an azo type radical polymerization initiator; thermosetting resins other than the epoxy resin, such as an epoxy acrylate resin, a urethane acrylate resin, a urethane resin, a cyanate resin, a benzoxazine resin, an unsaturated polyester resin, a phenol resin, a melamine resin, and a silicone resin; organic metal compounds such as an organic copper compound, an organic zinc compound, and an organic cobalt compound; colorants such as a phthalocyanine blue, a phthalocyanine green, an iodine green, a diazo yellow, a crystal violet, titanium oxide, and carbon black; polymerization inhibitors such as hydroguinone, catechol, pyrogallol, and phenothiazine; leveling agents such as a silicone type leveling agent and an acrylic polymer type leveling agent; thickeners such as bentone and montmorillonite; antifoaming agents such as a silicone type antifoaming agent, an acrylic type antifoaming agent, a fluorine type antifoaming agent, and a vinyl resin type antifoaming agent; UV absorbers such as a benzotriazole type UV absorber; adhesion enhancers such as a urea silane; adhesion assisting agents such as a triazole type adhesion assisting agent, a tetrazole type adhesion assisting agent, and a triazine type adhesion assisting agent; antioxidants such as a hindered phenol type antioxidant; fluorescent whitening agents such as a stilbene derivative; surfactants such as a fluorine type surfactant and a silicone type surfactant; flame retardants such as phosphorous type flame retardants (e.g., a phosphate ester compound, a phosphazene compound, a phosphinate compound, and a red phosphorous), nitrogen type flame retardants (e.g., melamine sulfate), halogen type flame retardants, and inorganic type flame retardants (e.g., antimony trioxide); dispersants such as a phosphate ester type dispersant, a polyoxyalkylene type dispersant, an acetylene type dispersant, a silicone type dispersant, an anionic dispersant, and a cationic dispersant; and stabilizers such as a borate type stabilizer, a titanate type stabilizer, an aluminate type stabilizer, a zirconate type stabilizer, an isocyanate type stabilizer, a carboxylate type stabilizer, and a carboxylic anhydride type stabilizer. The (I) other additive may be used singly or as a combination of two or more of these additives at any mixing ratio. The content of the (I) other additive may be set as appropriate by a person ordinarily skilled in the art.

Support

The resin sheet according to the present invention has a support. Illustrative examples of the support in the resin sheet according to the present invention include a film formed of a plastic material, metal foil, and a releasing paper; among these, a film formed of a plastic material and metal foil are preferable.

When the film formed of a plastic material is used as the support, illustrative examples of the plastic material include: polyesters such as polyethylene terephthalate (hereinafter, sometimes this is referred to as simply "PET") and polyethylene naphthalate (hereinafter, sometimes this is referred to as simply "PEN"); polycarbonate (hereinafter, sometimes this is referred to as simply "PC"); acrylic polymers such as polymethyl methacrylate (PMMA); cyclic polyolefins; triacetyl cellulose (TAC); polyether sulfide (PES); polyether ketones; and polyimides. Among these substances, polyethylene terephthalate and polyethylene naphthalate are preferable, in which cheap polyethylene terephthalate is especially preferable.

When the metal foil is used as the support, illustrative examples of the metal foil include copper foil and aluminum foil, in which copper foil is preferable. As for the copper foil, the foil formed of a copper single metal or an alloy of copper with other metal (for example, tin, chromium, silver, magnesium, nickel, zirconium, silicon, or titanium) may be used.

The support may be subjected to a mat treatment or a corona treatment on the surface to be bonded with the resin composition layer.

As for the support, a releasing layer-attached support having the releasing layer on the surface to be bonded with the resin composition layer may also be used. The releasing agent to be used for the releasing layer of the releasing layer-attached support is, for example, one or more releasing agents selected from the group consisting of an alkyd type releasing agent, a polyolefin type releasing agent, a urethane type releasing agent, and a silicone type releasing agent. Commercially available products may be used as the releasing layer-attached support; they are, for example, a PET film having a releasing layer mainly formed of a silicone type releasing agent or an alkyd resin type releasing agent; so, illustrative examples thereof include: "PET501010", "SK-1", "ΔL-5", and "ΔL-7", all manufactured by Lintec Corp.; "Lumirror T60" manufactured by Toray Industries, Inc.; "Purex" manufactured by Teijin Ltd.; and "Unipeel" manufactured by Unitika Ltd.

Although there is no particular restriction in the thickness of the support, this is preferably in the range of 5 to 75 μm, and more preferably in the range of 10 to 60 μm. When the releasing layer-attached support is used, total thickness of the releasing layer-attached support is preferably within the above-mentioned range.

Protective Film

The resin sheet according to the present invention may be further laminated with a protective film, which is similar to the support and is formed on the surface of the resin composition layer not bonded to the support (namely, on the surface opposite to the support). There is no particular restriction in the thickness of the protective film; this is, for example, in the range of 1 to 40 μm. Being laminated with the protective film, the surface of the resin composition (layer) may be prevented from attachment of dirt or from formation of a scar. The resin sheet may be rolled up so as to be stored. When the resin sheet includes the protective film, usually the resin sheet can be used by removing the protective film.

Method for Production of the Resin Sheet

The resin sheet according to the present invention may be produced, for example, by applying a resin composition in the form of varnish (resin varnish) onto a support by using a die coater or the like, which is then followed by drying to form the resin composition (layer) on the support.

The content of the (B) organic solvent in the resin composition in the form of varnish (resin varnish) is not particularly restricted, but the content can be preferably 40% or less by mass, more preferably 35% or less by mass, and especially preferably 30% or less by mass, relative to 100% by mass of the nonvolatile components in the resin composition in the form of varnish.

The content of the aromatic solvent whose boiling point is lower than 120° C. in the (B) organic solvent contained in the resin composition in the form of varnish (resin varnish) is preferably in the range of 0 to 20% by mass, more preferably in the range of 0 to 15% by mass, still more preferably in the range of 0 to 10% by mass, and especially preferably in the range of 0 to 5% by mass, relative to 100% by mass of total of the (B) organic solvent contained in the resin composition in the form of varnish.

Drying may be carried out by a method such as heating, blowing hot air, or the like. The temperature condition for drying is not particularly restricted, but the temperature may be set preferably in the range of 50 to 150° C., more preferably in the range of 60 to 130° C., and especially preferably in the range of 70 to 120° C. The drying time depends on the thickness of the resin composition (layer) and on the components contained in the resin composition, but the time can be set, for example, in the range of 1 to 10 minutes.

Method for Production of Resin Composition in the Form of Varnish (Resin Varnish)

The resin composition in the form of varnish (resin varnish) may be produced, for example, by adding to an arbitrary preparation vessel, the (A) epoxy resin, the (B) organic solvent, the (C) inorganic filler, the (D) stress relaxing material, the (E) curing agent if necessary, the (F) curing accelerator if necessary, the (G) radical polymerizable compound if necessary, the (H) thermoplastic resin if necessary, and the (I) other additive if necessary, in any order and/or by adding a part or all of them simultaneously followed by mixing. At the process of adding and mixing each component, the temperature may be set as desired and may be heated and/or cooled temporarily or throughout the process. In the course of adding and mixing or thereafter, the resin composition may be stirred or shaken using, for example, a mixer or other stirring equipment or shaking equipment to accomplish uniform dispersion. Defoaming may be performed simultaneously with stirring or shaking under a low pressure condition, such as under vacuum.

Characteristics of Resin Sheet

In the resin composition (layer) in the resin sheet according to the present invention, containing the (A) epoxy resin, the (B) organic solvent, the (C) inorganic filler, and the (D) stress relaxing material, the content of the aromatic solvent having a boiling point of lower than 120° C. in the (B) organic solvent is in the range of 0 to 9% by mass relative to 100% by mass as total of the (B) component. By using the resin sheet described above, the irregularity after lamination can be suppressed, and also the warpage after curing can be suppressed.

The resin sheet according to the present invention can be characterized by its ability to reduce the occurrence of the irregularity after lamination. Therefore, in one embodiment, after laminating the resin sheet according to the present invention onto the inner layer substrate, as can be seen in Test Example 4 to be described later, no indentation can be observed in the resin composition (layer) around the inner layer substrate.

The cured product of the resin composition (layer) in the resin sheet according to the present invention can be characterized by its ability to suppress the warpage. Therefore, the warpage, measured as in Test Example 5 to be described later, can preferably be 2 mm or less.

In one embodiment, the resin sheet according to the present invention can achieve good laminability because the melt viscosity can be lowered while still using the (B) inorganic filler. Therefore, in one embodiment, as can be seen in Test Example 3 to be described later, the melt viscosity of the resin composition (layer) at 100° C. in the resin sheet according to the present invention can be made preferably 50,000 poise or lower, more preferably 30,000 poise or lower, still more preferably 20,000 poise or lower, far still more preferably 15,000 poise or lower, and especially preferably 13,000 poise or lower. The lower limit of the melt viscosity of the resin composition (layer) at 100° C. can be, for example, 100 poise or higher.

In one embodiment, the cured product of the resin composition (layer) in the resin sheet according to the present invention can have the characteristics that the dielectric loss tangent (Df) is low. Accordingly, in one embodiment, when measured at 10 GHz and 23° C., as in Test Example 6 to be described later, the dielectric loss tangent (Df) of the cured product of the resin composition can be preferably 0.0200 or lower, or 0.0150 or lower, more preferably 0.00120 or lower, or 0.0100 or lower, still more preferably 0.0095 or lower, or 0.0090 or lower, and especially preferably 0.0085 or lower, or 0.0080 or lower.

In one embodiment, the side of the resin composition (layer) of the resin sheet, which is not in contact with the support, is exposed to the outside air (the other side is the laminated side with the support) and from the viewpoint of further lowering the dielectric loss tangent (Df) and further suppressing the warpage, the weight reduction rate after heat-treated at 190° C. (under normal pressure) for 30 minutes as can be seen in Test Example 2 to be described later can be preferably 10% or less by mass, more preferably 9% or less by mass, still more preferably 8% or less by mass, and especially preferably 7% or less by mass; and from the viewpoint of achieving better laminability, the lower limit thereof can be preferably 1% or more by mass, more preferably 1.4% or more by mass, still more preferably 1.6% or more by mass, and especially 1.8% or more by mass.

Use of Resin Sheet (Resin Composition)

The resin sheet (resin composition) according to the present invention may be suitably used as the resin sheet (resin composition) for an insulation use, especially used as the resin sheet (resin composition) to form an insulating layer. Specifically, this can be preferably used as the resin sheet (resin composition) for forming the insulating layer to form a conductive layer (including a rewiring layer) formed on the insulating layer (resin sheet (resin composition) for forming an insulating layer to form a conductive layer). Also, in the printed wiring board to be described later, this may be preferably used as the resin sheet (resin composition) to form an insulating layer of a printed wiring board (as the resin sheet (resin composition) to form an insulating layer of a printed wiring board), and more preferably to form an interlayer insulating layer of a printed wiring board (for interlayer insulating layer of a printed wiring board). Because the resin sheet (resin composition) according to the present invention can provide the insulating layer having an excellent component-embedding property, this can also be preferably used when the printed wiring board is a component-embedded circuit board.

Also, for example, when a semiconductor chip package is manufactured by the processes (1) through (6) below, the resin sheet (resin composition) according to the present invention can be preferably used as the resin sheet (resin composition) for forming a rewiring layer (resin sheet (resin composition) for forming a rewiring formation layer) in the semiconductor package and the resin composition for encapsulating a semiconductor chip (resin sheet (resin composition) for encapsulating a semiconductor) in the semiconductor package. At the time when the semiconductor chip package is manufactured, a rewiring layer may be further formed on the encapsulation layer.

(1) a process of laminating a temporary fixing film on a substrate;

(2) a process for temporarily fixing a semiconductor chip on the temporary fixing film;

(3) a process of forming an encapsulation layer on the semiconductor chip;

(4) a process of peeling the substrate and the temporary fixing film from the semiconductor chip;

(5) a process of forming a rewiring formation layer as an insulating layer on the surface of the semiconductor chip from which the substrate and the temporary fixing film have been peeled off; and (6) a process of forming a rewiring layer as a conductive layer on the rewiring formation layer.

Printed Wiring Board

The resin sheet according to the present invention can be used in the production of a printed wiring board. The printed wiring board includes an insulating layer obtained by curing the resin composition (layer) in the resin sheet according to the present invention.

The printed wiring board may be produced, for example, by the method including the processes (I) and (II) described below using the resin sheet according to the present invention.

(I) A process of laminating a resin sheet on an inner layer substrate such that the resin composition (layer) of the resin sheet is bonded to the inner layer substrate.

(II) A process of forming an insulating layer by curing (e.g., thermosetting) the resin composition (layer).

The "inner layer substrate" used at the process (I) is a member that is the substrate for a printed wiring board; and illustrative examples thereof include a glass epoxy substrate, a metal substrate, a polyester substrate, a polyimide substrate, a BT resin substrate, and a thermosetting type polyphenylene ether substrate. This substrate may have a conductive layer on one or both sides thereof; herein, the conductive layer may be patterned. The inner layer substrate having the conductive layer (circuit) on one or both sides of the substrate is sometimes referred to as an "inner layer circuit board". An intermediate product to which an insulating layer and/or a conductive layer is/are to be further formed at the time when producing a printed wiring board is also included in the "inner layer substrate" that is referred to in the present invention. In the case when the printed wiring board is a circuit board having a built-in component, an inner layer substrate having a built-in component may be used.

Lamination of the inner layer substrate with the resin sheet may be conducted, for example, by hot-pressing of the resin sheet to the inner layer substrate by pressing from the side of the support. Illustrative examples of the member for hot-pressing of the resin sheet to the inner layer substrate (hereinafter, this member is sometimes referred to as "hot-pressing member") include a heated metal plate (stainless steel (SUS) mirror plate and the like) and a heated metal roll (SUS roll). Herein, it is preferable that the hot-pressing member be not pressed directly to the resin sheet but be pressed via an elastic material such as a heat-resistant rubber in order that the resin sheet well follows the surface irregularity of the inner layer substrate.

Lamination of the inner layer substrate with the resin sheet may be conducted by a vacuum lamination method. The temperature of the hot-press adhesion in the vacuum lamination is preferably in the range of 60 to 160° C., and more preferably in the range of 80 to 140° C.; and the pressure of the hot-press adhesion is preferably in the range of 0.098 to 1.77 MPa, and more preferably in the range of 0.29 to 1.47 MPa; and the period of the hot-press adhesion is preferably in the range of 20 to 400 seconds, and more preferably in the range of 30 to 300 seconds. The lamination can be carried out under a reduced pressure, preferably 26.7 hPa or less.

The lamination may be carried out by using a commercially available laminator. Illustrative examples of the commercially available vacuum laminator include a vacuum pressing type laminator manufactured by Meiki Co., Ltd., and a vacuum applicator and a batch-type vacuum pressing laminator manufactured by Nikko-Materials Co., Ltd.

After the lamination, the laminated resin sheet may be flattened by pressing the hot-pressing member from the side of the support under a normal pressure (under an atmospheric pressure). The pressing conditions at the flattening process may be the same as the hot-press adhering condition in the before-mentioned lamination. The flattening process may be carried out by using a commercially available laminator. The lamination and the flattening processes may be carried out continuously by using the commercially available vacuum laminator described before.

The support may be removed between the process (I) and the process (II), or after the process (II).

At the process (II), an insulating layer is formed by curing (e.g., thermosetting) the resin composition (layer). There is no particular restriction in the curing condition of the resin composition (layer); herein, the conditions generally used in formation of the insulating layer in a printed wiring board may be used.

The condition for thermal curing of the resin composition (layer) varies depending on the composition contained in the resin composition (layer) and so forth; for example, in one embodiment, the curing temperature is preferably in the range of 120 to 240° C., more preferably in the range of 150 to 220° C., and still more preferably in the range of 170 to 210° C. The curing time can be preferably in the range of 5 to 120 minutes, more preferably in the range of 10 to 100 minutes, and still more preferably in the range of 15 to 100 minutes.

Before thermally curing the resin composition (layer), the resin composition (layer) may be preheated at the temperature lower than the curing temperature. For example, before thermally curing the resin composition (layer), the resin composition (layer) may be preliminarily heated at 50 to 120° C., preferably 60 to 115° C., while more preferably 70 to 110° C., and for the period of 5 minutes or longer, preferably 5 to 150 minutes, more preferably 15 to 120 minutes, and still more preferably 15 to 100 minutes.

In production of a printed wiring board, (III) a process of drilling a hole in the insulating layer, (IV) a process of roughening the insulating layer, and (V) a process of forming a conductive layer may be further carried out. These processes (III) through (V) may be carried out by any method known to a person ordinarily skilled in the art for production of a printed wiring board. In the case where the support is removed after the process (II), the removal of the support may be carried out between the process (II) and the process (III), between the process (III) and the process (IV), or between the process (IV) and the process (V). When necessary, formation of the insulating layer and the conductive layer in processes (II) through (V) may be repeated to form a multilayered wiring board.

The process (III) is the process of drilling a hole in the insulating layer, such as a via hole, a through hole, and the like in the insulating layer. The process (III) may be carried out by using, for example, a drilling method, a laser method, a plasma method, or the like, in accordance with, the composition of the resin composition (layer) that is used to form the insulating layer. The size and shape of the hole may be determined as appropriate in accordance with a design of the printed wiring board.

The process (IV) is the process of roughening the insulating layer. Usually, a smear is also removed at this process (IV). There is no particular restriction in the procedure and condition at the roughening process; for example, the procedure and condition that are usually used in formation of the insulating layer of a printed wiring board may be used. The insulating layer may be roughened by carrying out, for example, a swelling treatment using a swelling liquid, a roughening treatment using an oxidant, and a neutralizing treatment using a neutralizing solution in this order.

There is no particular restriction in the swelling liquid to be used at the roughening process; herein, examples thereof include an alkali solution and a surfactant solution, in which an alkali solution is preferable, and further, a sodium hydroxide solution and a potassium hydroxide solution are more preferable as the alkali solution. Illustrative examples of the swelling liquid that is commercially available include "Swelling Dip Securiganth P" and "Swelling Dip Securiganth SBU", which are both manufactured by Atotech Japan Co., Ltd. There is no particular restriction in the swelling treatment with the swelling liquid; for example, this may be carried out by immersing the insulating layer into the swelling liquid at 30 to 90° C. for the period of 1 to 20 minutes. From the viewpoint of suppressing swelling of the resin in the insulating layer to a suitable level, it is preferable that the insulating layer be immersed into the swelling liquid at 40 to 80° C. for the period of 5 to 15 minutes.

There is no particular restriction in the oxidant to be used in the roughening treatment; herein, illustrative examples thereof include an alkaline permanganate solution having potassium permanganate or sodium permanganate dissolved into an aqueous sodium hydroxide solution. The roughening treatment using the oxidant such as the alkaline permanganate solution may be carried out preferably by immersing the insulating layer into the oxidant solution heated at 60 to 100° C. for the period of 10 to 30 minutes. The concentration of the permanganate salt in the alkaline permanganate solution is preferably 5 to 10% by mass. Illustrative examples of the oxidant that is commercially available include alkaline permanganate solutions such as "Concentrate Compact CP" and "Dosing Solution Securiganth P", which are both manufactured by Atotech Japan, Co., Ltd.

As a neutralizing solution to be used for the roughening treatment, acidic solution is preferable. Illustrative examples of the commercially available neutralizing solution to be used for the roughening treatment include "Reduction Solution Securiganth P", which is manufactured by Atotech Japan Co., Ltd.

The treatment with the neutralizing solution may be carried out by immersing the surface, which has been treated with the roughening treatment using the oxidant, into the neutralizing solution at 30 to 80° C. for the period of 5 to 30 minutes. From the viewpoint of workability and the like, it is preferable to immerse the subject, which has been treated with the roughening process using the oxidant, in the neutralizing solution at 40 to 70° C. for the period of 5 to 20 minutes.

In one embodiment, there is no particular restriction in the arithmetic average roughness (Ra) of the surface of the insulating layer after the roughening treatment; herein, the roughness is preferably 500 nm or less, more preferably 400 nm or less, and still more preferably 300 nm or less. There is no particular restriction in the lower limit thereof; for example, this can be 1 nm or more, or 2 nm or more. The root mean square surface roughness (Rq) of the surface of the insulating layer after the roughening treatment is preferably 500 nm or less, more preferably 400 nm or less, and still more preferably 300 nm or less. There is no particular restriction in the lower limit thereof; for example, this can be 1 nm or more, or 2 nm or more. The arithmetic surface roughness (Ra) and the root mean square surface roughness (Rq) may be measured by using a non-contact type surface roughness meter.

The process (V) is the process of forming a conductive layer, at which process a conductive layer is formed on the insulating layer. There is no particular restriction in the conductive material to be used in the conductive layer. In a preferred embodiment, the conductive layer includes one or more metals selected from the group consisting of gold, platinum, palladium, silver, copper, aluminum, cobalt, chromium, zinc, nickel, titanium, tungsten, iron, tin, and indium. The conductive layer may be a single metal layer or an alloy layer, in which the alloy layer is, for example, a layer formed from an alloy of two or more metals selected from the group described above (e.g., a nickel-chromium alloy, a copper-nickel alloy, and a copper-titanium alloy). Among these, in view of general applicability in formation of the conductive layer, cost, easiness in patterning, and the like, preferably usable are single metal layers of chromium, nickel, titanium, aluminum, zinc, gold, palladium, silver, or copper, as well as alloy layers of a nickel-chromium alloy, a copper-nickel alloy, or a copper-titanium alloy; more preferable are single metal layers of chromium, nickel, titanium, aluminum, zinc, gold, palladium, silver, or copper, as well as alloy layers of a nickel-chromium alloy; still more preferable is a single metal layer of copper.

The conductive layer may be a monolayer structure or a multilayer structure, and in the multilayer structure, two or more of monolayers or alloy layers can be laminated, and the monolayer can be formed of the single metal layer formed of different metals, or can be formed of the alloy layers. When the conductive layer has the multilayer structure, the layer in contact with the insulating layer is preferably a single metal layer of chromium, zinc, or titanium, or an alloy layer of a nickel-chromium alloy.

The thickness of the conductive layer is generally in the range of 3 μm to 35 μm, and preferably in the range of μm to 30 μm, but this varies depending on the intended design of the printed wiring board.

In one embodiment, the conductive layer may be formed by plating. For example, the conductive layer having an intended wiring pattern may be formed by plating on the surface of the insulating layer using a conventionally known technique such as a semi-additive method and a full-additive method. From the viewpoint of simplicity in production thereof, it is preferable to form the conductive layer by a semi-additive method. Hereinafter, an example of forming the conductive layer by a semi-additive method will be described.

First, a plating seed layer is formed on the surface of the insulating layer by an electroless plating. Next, on the formed plating seed layer a mask pattern is formed to expose a part of the plating seed layer correspondingly to the intended wiring pattern. After forming a metal layer on the exposed plating seed layer by an electrolytic plating, the mask pattern is removed. Then, an unnecessary plated seed layer is removed by etching or the like, so that the conductive layer having the intended wiring pattern can be formed.

In another embodiment, the conductive layer may be formed using metal foil. When metal foil is used to form the conductive layer, it is preferable to carry out the process (V) between the process (I) and the process (II). For example, after the process (I), the support is removed, and then, metal foil is laminated on the surface of the exposed resin composition layer. Lamination of the resin composition layer with the metal foil may be carried out by a vacuum lamination method. The conditions for lamination may be the same as those described for the process (I). Next, the process (II) is carried out to form the insulating layer. Then, by using the metal foil on the insulating layer, the conductive layer having the intended wiring pattern can be formed by a conventional known technique such as a subtractive method or a modified semi-additive method.

The metal foil may be produced, for example, by a known method such as an electrolysis method or a rolling method. Illustrative examples of the commercially available metal foil include HLP foil and JXUT-III foil, both manufactured by JX Nippon Mining & Metals Corp., and 3EC-III foil and TP-III foil, both manufactured by Mitsui Mining & Smelting Co., Ltd.

Semiconductor Device

The printed wiring board described above can be used for a semiconductor device that includes a printed wiring board.

The semiconductor device includes various semiconductor devices that are used in electric products (for example, a computer, a cell phone, a digital camera, a television), and carriers (for example, a motor bike, an automobile, a train, a marine ship, and an airplane), and so forth.

Other features of the invention will become apparent in the course of the following descriptions of exemplary embodiments which are given for illustration of the invention and are not intended to be limiting thereof.

EXAMPLES

In the description below, "part" and "%" that describe quantities mean "part by mass" and "% by mass", respectively, unless otherwise specifically mentioned. In the case that temperature and pressure are not specified, the temperature condition is room temperature (23° C.) and the pressure condition is normal pressure (I atm).

Synthesis Example 1: Synthesis of Elastomer A

In a reaction vessel, 69 g of polybutadiene terminated with bifunctional hydroxy group ("G-3000", number-average molecular weight of 3000, hydroxy equivalent of 1800 g/eq.; manufactured by Nippon Soda Co., Ltd.), 40 g of PGMEA (propylene glycol monomethyl ether acetate; manufactured by Showa Denko K. K.), and 0.005 g of dibutyl tin laurate were mixed and dissolved uniformly. When uniformity was reached, the temperature was raised to 60° C., and 8 g of isophorone diisocyanate ("IPDI", isocyanate equivalent of 113 g/eq.; manufactured by Evonik Degussa Japan, Co., Ltd.) was added with further stirring, and the reaction was carried out for about 3 hours.

Then, 23 g of cresol novolac resin ("KA-1160", hydroxy equivalent of 117 g/eq.; manufactured by DIC Corporation) and 60 g of PGMEA were added to the reaction mixture, and the reaction was carried out under reflux at 150° C. for about 10 hours with stirring. Disappearance of the NCO peak at 2250 cm-1 was confirmed by FT-IR. Confirmation of the disappearance of the NCO peak was considered to be the endpoint of the reaction, and then, the reaction mixture was allowed to cool to room temperature. The reactant was then filtrated through a 100-mesh filter cloth to obtain Elastomer A having a polybutadiene structure and a phenolic hydroxy group (polybutadiene resin containing a phenolic hydroxy group: nonvolatile components of 50% by mass). The number-average molecular weight and the glass transition temperature of Elastomer A were 5900 and −7° C., respectively.

Synthesis Example 2: Synthesis of Elastomer B

In a flask equipped with a stirrer, a thermometer, and a condenser, 736 g of PGMEA was charged as a solvent. In addition, 100.1 g (0.4 mole) of diphenylmethane diisocyanate and 400 g (0.2 mole) of polycarbonate diol ("C-2015N", average molecular weight of approx. 2000, hydroxy equivalent pf 1000 g/eq., nonvolatile components of 100%; manufactured by Kuraray Co., Ltd.) were added to the flask, and the reaction was carried out for 4 hours at 70° C.

Then, 195.9 g (0.2 mole) of nonylphenol novolac resin (hydroxy equivalent of 229.4 g/eq, average functionality of 4.27, average calculated molecular weight of 979.5 g/mol) and 41.0 g (0.1 mole) of ethylene glycol bisanhydrotrimellitate were added to the flask; then, after the temperature was raised to 150° C. over a period of 2 hours, the reaction was carried out for 12 hours. Disappearance of the NCO peak at 2250 $cm^{-1}$ was confirmed by FT-IR. Confirmation of the disappearance of the NCO peak was considered to be the endpoint of the reaction, and then, the reaction mixture was allowed to cool to room temperature. Elastomer B (nonvolatile components of 50% by mass) having a polycarbonate structure was then obtained by filtration through a 100-mesh filter cloth. The number-average molecular weight and the glass transition temperature of Elastomer B were 6100 and 5° C., respectively.

Synthesis Example 3: Synthesis of Maleimide Compound A

Maleimide Compound A (Mw/Mn=1.81, a'=1.47 (mainly 1, 2, or 3)) represented by the following formula (1), which was synthesized by the method described in Synthesis Example 1 in the Public Technical Report No. 2020-500211, Journal of Technical Disclosure, Japan Institute for Promoting Invention and Innovation, which is incorporated herein by reference in its entirety, was prepared.

(1)

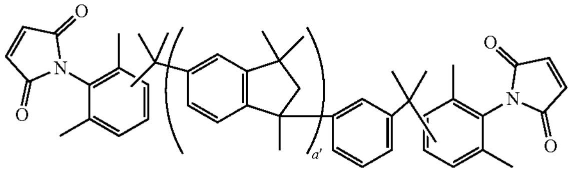

Example 1

Five parts of bisphenol A type epoxy resin ("828EL", epoxy equivalent of 189 g/eq.; manufactured by Mitsubishi Chemical Corp.), 1 part of biphenyl type epoxy resin ("NC3000L", epoxy equivalent of 271 g/eq.; manufactured by Nippon Kayaku Co., Ltd.), 1 part of carbodiimide type curing agent ("V-03", active group equivalent of approx. 216, toluene solution with solid content of 50% by mass; manufactured by Nisshinbo Chemical Inc.), 3 parts of cresol novolac resin ("KA-1160", phenolic hydroxy equivalent of 117 g/eq.; manufactured by DIC Corporation), 20 parts of Elastomer A (PGMEA solution with solid content of 50% by mass), 4 parts of maleimide compound ("BMI-689" manufactured by Designer Molecules, Inc.), 65 parts of spherical silica ("SO—C2", average particle diameter of 0.5 μm, specific surface area of 5.8 $m^2/g$; manufactured by Admatechs Co., Ltd.) having the surface thereof treated with the aminosilane type coupling agent ("KBM573", manufactured by Shin-Etsu Chemical Co., Ltd.), 0.05 parts of curing accelerator ("1B2PZ", 1-benzyl-2-phenylimidazole; manufactured by Shikoku Chemicals Corp.), 10 parts of methyl ethyl ketone (MEK), and 5 parts of cyclohexanone (anone) were mixed and uniformly dispersed by means of a high-speed rotary mixer to prepare a resin composition in the varnish form (resin varnish).

Next, a PET film ("Lumirror R80", thickness of 38 μm, softening point of 130° C.; manufactured by Toray Industries, Inc.) having one main surface thereof treated with an alkyd resin type releasing agent ("ΔL-5", manufactured by Lintec Corp.) was prepared as the support (hereinafter, sometimes this is referred to as "release PET").

The resin composition (resin varnish) obtained above was uniformly applied onto the release treated surface of the release PET by means of a die coater in such a way that the thickness of the resin composition layer after drying might become 50 μm. Then, the resin varnish was dried in the temperature range of 80 to 120° C. (average temperature of 100° C.). Drying time was adjusted by the method in Test Example 2 to be described later such that the weight reduction rate due to the heat treatment might become the value described in Table 1 below. In this way, the resin sheet containing the support and the resin composition layer formed on the said support was produced.

Example 2

The resin sheet was prepared in the same manner as Example 1, except that 1 part of the carbodiimide type curing agent ("V-03", active group equivalent of approx. 216, toluene solution with solid content of 50% by mass; manufactured by Nisshinbo Chemical Inc.) was not used, that the amount of the cresol novolac resin ("KA-1160", phenolic hydroxy equivalent of 117 g/eq.; manufactured by DIC Corporation) was changed from 3 parts to 3.5 parts, and that 0.5 parts of toluene was added.

Example 3

The resin sheet was prepared in the same manner as Example 1, except that the amount of spherical silica ("SO—C2", average particle diameter of 0.5 μm, specific surface area of 5.8 $m^2/g$; manufactured by Admatechs Co., Ltd.) having the surface thereof treated with the aminosilane type coupling agent ("KBM573", manufactured by Shin-Etsu Chemical Co., Ltd.) was changed from 65 to 60 parts, that 1 part of the carbodiimide type curing agent ("V-03", active group equivalent of approx. 216, toluene solution with solid content of 50% by mass; manufactured by Nisshinbo Chemical Inc.) was not used, that 4 parts of the maleimide compound ("BMI-689" manufactured by Designer Molecules, Inc.) was not used, that the amount of the cresol novolac resin ("KA-1160", phenolic hydroxy equivalent of 117 g/eq.; manufactured by DIC Corporation) was changed from 3 to 3.5 parts, and that 0.5 parts of toluene was added.

Example 4

Five parts of bisphenol A type epoxy resin ("828EL", epoxy equivalent of 189 g/eq.; manufactured by Mitsubishi Chemical Corp.), 1 part of biphenyl type epoxy resin ("NC3000L", epoxy equivalent of 271 g/eq.; manufactured by Nippon Kayaku Co., Ltd.), 3 parts of active ester type curing agent ("HPC-8000L-65TM", active group equivalent of approx. 223, the solution of toluene and MEK in a ratio of 1:1 with nonvolatile content of 65% by mass; manufactured by DIC, Corp.), 2 parts of cresol novolac type curing agent containing a triazine backbone ("LA3018-50P", hydroxy equivalent of 151, propylene glycol monomethyl ether (PGM) solution with nonvolatile content of 50%; manufactured by DIC, Corp.), 10 parts of Elastomer A (PGMEA solution with solid content of 50% by mass), 4 parts of Maleimide Compound A, 60 parts of spherical silica ("SO—C2", average particle diameter of 0.5 μm, specific surface area of 5.8 $m^2/g$; manufactured by Admatechs Co., Ltd.) having the surface thereof treated with the aminosilane type coupling agent ("KBM573", manufactured by Shin-Etsu Chemical Co., Ltd.), 0.05 parts of curing accelerator (4-dimethylaminopyridine; manufactured by Wako Pure Chemical Industries Ltd.), 9.48 parts of methyl ethyl ketone (MEK), 0.53 parts of toluene, and 5 parts of cyclohexanone (anone) were mixed and uniformly dispersed by means of a high-speed rotary mixer to obtain the resin composition in the form of varnish (resin varnish). Using the resin composition (resin varnish) thus obtained, the resin sheet was obtained in the same manner as Example 1.

Example 5

The resin sheet was prepared in the same manner as Example 4, except that 3 parts of the active ester type curing agent ("HPC-8000L-65TM", active group equivalent of approx. 223, the solution of toluene and MEK in a ratio of 1:1 with nonvolatile content of 65% by mass; manufactured by DIC Corporation) was not used, that the amount of the cresol novolac curing agent containing a triazine backbone ("LA3018-50P", hydroxy equivalent of 151, propylene glycol monomethyl ether (PGM) solution with nonvolatile content of 50%; manufactured by DIC Corporation) was changed from 2 to 5.9 parts, that the amount of methyl ethyl ketone (MEK) was changed from 9.48 to 10 parts, and that 0.53 parts of toluene was not used.

Example 6

The resin sheet was prepared in the same manner as Example 1, except that in place of 65 parts of the spherical silica ("SO—C2", average particle diameter of 0.5 μm, specific surface area of 5.8 $m^2/g$; manufactured by Admatechs Co., Ltd.) having the surface thereof treated with the aminosilane type coupling agent ("KBM573", manufactured by Shin-Etsu Chemical Co., Ltd.), 50 parts of the spherical silica ("SO—C4", average particle diameter of 1.1 μm, specific surface area of 4.5 $m^2/g$; manufactured by Admatechs Co., Ltd.) having the surface thereof treated with the aminosilane type coupling agent ("KBM573", manufactured by Shin-Etsu Chemical Co., Ltd.) was used, that in place of 0.05 parts of the curing accelerator ("1B2PZ", 1-benzyl-2-phenylimidazole; manufactured by Shikoku Chemicals Corp.), 0.05 parts of the curing accelerator ("4-dimethylaminopyridine"; manufactured by Wako Pure Chemical Industries Ltd.) was used, that in place of 4 parts of the maleimide compound ("BMI-689" manufactured by Designer Molecules, Inc.), 4 parts of Maleimide Compound A was used, and that the amount of methyl ethyl ketone (MEK) was changed from 10 to 15 parts.

Example 7

Three parts of bisphenol A type epoxy resin ("828EL", epoxy equivalent of 189 g/eq.; manufactured by Mitsubishi Chemical Corp.), 1 part of biphenyl type epoxy resin ("NC3000L", epoxy equivalent of 271 g/eq.; manufactured by Nippon Kayaku Co., Ltd.), 2 parts of naphthol aralkyl type epoxy resin ("ESN475V", epoxy equivalent of 332 g/eq.; manufactured by NIPPON STEEL Chemical & Material Co., Ltd.), 10 parts of Elastomer B (PGMEA solution with solid content of 50% by mass), 5 parts of "Paraloid EXL-2655" manufactured by Dow Chemical Japan Ltd., 4.6 parts of active ester type curing agent ("PC1300-02-65MA", active group equivalent of approx. 199, MAK solution with 65% by mass of nonvolatile content; manufactured by Air Water Inc.), 0.05 parts of curing accelerator ("4-dimethylaminopyridine" manufactured by Wako Pure Chemical Industries Ltd.), 3 parts of thermoplastic resin ("YX7200B35", Anone solution with 35% nonvolatile content; manufactured by Mitsubishi Chemical Corp.), 50 parts of spherical silica ("SO—C2", average particle diameter of 0.5 μm, specific surface area of 5.8 $m^2/g$; manufactured by Admatechs Co., Ltd.) having the surface thereof treated with the aminosilane type coupling agent ("KBM573", manufactured by Shin-Etsu Chemical Co., Ltd.), 15 parts of methyl ethyl ketone (MEK), and 1 part of diethylene glycol monoethyl ether acetate (EDGAC) were mixed and uniformly dispersed by means of a high-speed rotating mixer to prepare the resin composition in the form of varnish (resin varnish). Using the resin composition (resin varnish) thus obtained, the resin sheet was obtained in the same manner as Example 1.

Comparative Example 1

The resin sheet was prepared in the same manner as Example 1, except that 10 parts of toluene was used in place of 10 parts of methyl ethyl ketone (MEK).

Comparative Example 2

The resin sheet was prepared in the same manner as Example 1, except that the amount of spherical silica ("SO—C2", average particle diameter of 0.5 μm, specific surface area of 5.8 $m^2$/g; manufactured by Admatechs Co., Ltd.) having the surface thereof treated with the aminosilane type coupling agent ("KBM573", manufactured by Shin-Etsu Chemical Co., Ltd.) was changed from 65 to 40 parts, that the amount of Elastomer A (PGMEA solution with the solid content of 50% by mass) was changed from 20 parts to 1 part, and that 10 parts of toluene was used in place of 10 parts of methyl ethyl ketone (MEK).

Comparative Example 3

The resin sheet was prepared in the same manner as Example 1, except that 5 parts of toluene was used in place of 10 parts of methyl ethyl ketone (MEK), and that 5 parts of diethyleneglycol monobutyl ether (DB) was added.

Comparative Example 4

The resin sheet was prepared in the same manner as Example 1, except that the amount of the spherical silica ("SO—C2", average particle diameter of 0.5 μm, specific surface area of 5.8 me/g; manufactured by Admatechs Co., Ltd.) having the surface thereof treated with the aminosilane type coupling agent ("KBM573", manufactured by Shin-Etsu Chemical Co., Ltd.) was changed from 65 to 85 parts, that the amount of the carbodiimide type curing agent ("V-03", active group equivalent of approx. 216, toluene solution with solid content of 50% by mass; manufactured by Nisshinbo Chemical Inc.) was changed from 1 part to 10 parts, and that 10.5 parts of toluene was used in place of 10 parts of methyl ethyl ketone (MEK).

Comparative Example 5

The resin sheet was prepared in the same manner as Example 1, except that in place of 65 parts of the spherical silica ("SO—C2", average particle diameter of 0.5 μm, specific surface area of 5.8 $m^2$/g; manufactured by Admatechs Co., Ltd.) having the surface thereof treated with the aminosilane type coupling agent ("KBM573", manufactured by Shin-Etsu Chemical Co., Ltd.), 20 parts of the spherical silica ("SO—C4", average particle diameter of 1.1 μm, specific surface area of 4.5 $m^2$/g; manufactured by Admatechs Co., Ltd.) having the surface thereof treated with the aminosilane type coupling agent ("KBM573", manufactured by Shin-Etsu Chemical Co., Ltd.) was used, and that 10 parts of toluene was used in place of 10 parts of methyl ethyl ketone (MEK).

Test Example 1: Analysis of Organic Solvent in Resin

Composition Layer in Resin Sheet by GC/MS (Gas Chromatography Mass Spectrometry Five milligrams of a portion of the resin composition layer was weighed from the resin sheet prepared in each of Examples and Comparative Examples, and this sample was treated with GCMS-QP2020-NX (manufactured by Shimadzu Corp.) under the oven conditions of 250° C. for 10 minutes, and then, the measurement was conducted under the sample line temperature of 260° C., the transfer line temperature of 260° C., and the cycle time of 55 minutes. The solvent was identified from each of the detected peaks, and the types and contents of the organic solvents contained in the resin sheet of the resin sheet attached to the support were analyzed by referring to a calibration curve prepared in advance.

Test Example 2: Measurement of Weight Reduction Rate of Resin Composition Layer in Resin Sheet by Heat Treatment The resin sheet prepared in each of Examples and Comparative Examples was cut into the size of 10 cm×10 cm, and this was placed in a desiccator together with well-dried silica gel and was allowed to be left for 30 minutes. The mass (g) of the resin sheet was then measured with the protective film being peeled off, and the value was recorded as al (g). Next, the resin sheet was heated in an oven at 190° C. for 30 minutes and then cooled in the desiccator with silica gel for 30 minutes as before, and the mass (g) of the resin sheet was measured again; this value was recorded as α2 (g). Also, only the support was cut into the size of 10 cm×10 cm, and then, after this was placed in a desiccator and allowed to be left for 30 minutes, the mass of the support (g) was measured, and this value was recorded as β (g). The value of the weight reduction rate α (%) of the resin composition layer when the resin sheet was heat-treated at 190° C. for 30 minutes was calculated from the following formula (A).

$$\alpha = \frac{(\alpha 1 - \alpha 2)}{(\alpha 1 - \beta)} \times 100 \quad \text{(A)}$$

Test Example 3: Measurement and Evaluation of Melt Viscosity

The melt viscosity of each of the resin composition layers of the resin sheets prepared in Examples and Comparative Examples was measured. Using "Rheosol-G3000" (manufactured by UBM Co., Ltd.), melt viscosity of 1 g of the resin was measured with a parallel plate having a diameter of 18 mm under the conditions of a starting temperature of 60° C. till 200° C. at a temperature raising rate of 5° C./min, the temperature interval of 2.5° C., and the vibration of 1 Hz/deg; then, the evaluation was made according to the following evaluation criteria.

Evaluation Criteria

"○": The melt viscosity at 100° C. was 50,000 poise or less.

"X": The melt viscosity at 100° C. was more than 50,000 poise.

Test Example 4: Irregularity Evaluation after Lamination (1) Preparation of Inner Layer Substrate Both sides of a both-sides copper-clad glass cloth substrate epoxy resin laminate ("R1515A"; copper foil thickness of 18 μm; substrate thickness of 0.4 mm; manufactured by Panasonic Corp.) formed with an inner circuit were etched by 1 μm by means of a microetching agent ("CZ8101" manufactured by MEC Co., Ltd.) to roughen the copper surface.

(2) Lamination of Resin Sheet

The protective film was peeled off from the resin sheet prepared in each of Examples and Comparative Examples to expose the resin composition layer. A batch-type vacuum-pressure laminator (two-stage build-up laminator "CVP700", manufactured by Nikko-Materials Co., Ltd.) was used to laminate both sides of the inner substrate so as to make the resin composition layer in contact with the inner substrate. Lamination of resin sheet to the inner substrate was carried out by depressurizing over 30 seconds to bring the pressure to 13 hPa or less, followed by press adhesion of the resin sheet to the inner substrate with the pressure of 0.74 MPa and the temperature of 120° C. for seconds. Then, the laminated resin sheets were hot-pressed at 100° C. with the pressure of 0.5 MPa for 60 seconds.

(3) Curing of Resin Composition

The inner-layer substrate laminated with the resin sheet was heated in an oven at 130° C. for 30 minutes, followed by heating in a different oven at 170° C. for 30 minutes to thermally cure the resin composition layer to form an insulating layer. The support was then peeled off to obtain a cured substrate having the insulating layer, the inner substrate, and the insulating layer in this order.

(4) Evaluation of Irregularity of Cured Substrate

For both sides of the cured substrate, the surface uniformity of the area where the resin sheet was laminated (the surface opposite to the laminate plate) was observed visually and evaluated according to the following evaluation criteria.

Evaluation Criteria

"○": Irregularity was not observed at all, and the surface was completely uniform, or irregularity was observed only in the area 1 cm inside from the outer circumference of the area laminated with the resin sheet, and the surface inside that area was completely uniform.

"X": Irregularity was observed in the area 1 cm inside from the outer circumference of the area laminated with the resin sheet.

Test Example 5: Measurement and Evaluation of Warpage

The resin sheet prepared in each of Examples and Comparative Examples was laminated to the entire one side of a 12-inch silicon wafer (775 μm thickness) using a batch-type vacuum-pressure laminator (two-stage build-up laminator "CVP700", manufactured by Nikko-Materials Co., Ltd.), and then, the support was peeled off. Then, the resin sheet was further laminated on the resin composition layer having been laminated on the 12-inch silicon wafer to form a two-layered resin composition laminate thereby forming the resin composition layer having thickness of 100 μm. The resulting silicon wafer attached with the resin composition layer was heated in an oven at 180° C. for 90 minutes to form the silicon wafer attached with the cured resin composition layer (i.e., insulating layer). By using a shadow moiré measurement instrument (TherMoire AXP; manufactured by Akorometrix, LLC), the warpage amount of the silicon wafer attached with the insulating layer was measured at 25° C. Measurement was made in accordance with JEITA EDX-7311-24, which is the standard of the Japan Electronics and Information Technology Industries Association. Specifically, the virtual plane calculated by the least-squares method for all data on the substrate surface in the measurement area was used as the reference plane, and the difference between the minimum and maximum values in the vertical direction from the reference plane was measured as the amount of warpage and evaluated according to the following evaluation criteria.

Evaluation Criteria

"○": The warpage amount was 2 mm or less.

"X": The warpage was more than 2 mm.

Test Example 6: Measurement and Evaluation of Dielectric Loss Tangent

A portion of the resin sheet prepared in each of Examples and Comparative Examples was cut out and heated at 180° C. for 90 minutes to thermally cure the resin composition layer. The support was then peeled off to obtain the cured material for evaluation.

The cured material for evaluation was cut into the size of 2 mm wide and 80 mm long to obtain the test specimen. The obtained specimen was subjected to a cavity resonance perturbation method using "HP8362B" (manufactured by Agilent Technologies Inc.) to measure the dielectric loss tangent (Df) at a measurement frequency of 10 GHz and a measurement temperature of 23° C. Measurements were made on 2 test specimens, and the average value thereof was calculated to evaluate according to the following criteria.

Evaluation Criteria

"○": Dielectric loss tangent (Df) was 0.008 or less.

"Δ": Dielectric loss tangent (Df) was more than 0.008 and less than 0.010.

"X": Dielectric loss tangent (Df) was 0.010 or more.

Tables 1 and 2 below illustrate the contents of nonvolatile and volatile components in the resin compositions in the form of varnish obtained in Examples and Comparative Examples, as well as the measurement and evaluation results of Test Examples.

TABLE 1

| | | | | | Example | | | |
|---|---|---|---|---|---|---|---|---|
| | | | | | 1 | 2 | 3 | 4 |
| resin composition before drying (Resion varnish) | mass of nonvolatile component | (A) | epoxy resin | 828EL | 5 | 5 | 5 | 5 |
| | | | | NC3000L | 1 | 1 | 1 | 1 |
| | | | | ESN-475V | | | | |
| | | (C) | inorganic filler | SOC2 | 65 | 65 | 60 | 60 |
| | | | | SOC4 | | | | |
| | | (D) | stress relaxing material | elastomer A | 10 | 10 | 10 | 5 |
| | | | | elastomer B | | | | |
| | | | | EXL2655 | | | | |

TABLE 1-continued

| | | | | | | | |
|---|---|---|---|---|---|---|---|
| | | (E) curing agent | PC1300-02-65MA | | | | |
| | | | HPC-8000L-65TM | | | | 1.95 |
| | | | V-03 | 0.5 | | | |
| | | | LA3018-50P | | | | 1 |
| | | | KA-1160 | 3 | 3.5 | 3.5 | |
| | | (F) curing accelerator | 1B2PZ | 0.05 | 0.05 | 0.05 | |
| | | | DMAP | | | | 0.05 |
| | | (G) radical polymerizable compound | BMI-689 | 4 | 4 | | |
| | | | maleimide compound A | | | | 4 |
| | | (H) thermoplastic resin | YX7200B35 | | | | |
| | mass of volatile component | (B) organic solvent | MEK (non-aromatic bp 79° C.) | 10 | 10 | 10 | 10.01 |
| | | | Toluene (aromatic bp 110° C.) | 0.6 | 0.6 | 0.5 | 1.06 |
| | | | PGM (non-aromatic bp 120° C.) | | | | 1 |
| | | | PGMEA (non-aromatic bp 146° C.) | 10 | 10 | 10 | 5 |
| | | | MAK non-aromatic bp 151° C.) | | | | |
| | | | Anone (non-aromatic bp 155° C.) | 5 | 5 | 5 | 5 |
| | | | EDGAC (non-aromatic bp 217° C.) | | | | |
| | | | DB (non-aromatic bp 230° C.) | | | | |
| | total mass of all components (mass) | | | 114.1 | 114.1 | 105.1 | 100.1 |
| | total mass of nonvolatile components(mass) | | | 88.6 | 88.6 | 79.6 | 78.0 |
| | content relative to total mass of all nonvolatile components (% by mass) | (A) epoxy resin | | 6.8 | 6.8 | 7.5 | 7.7 |
| | | (C) inorganic filler | | 73.4 | 73.4 | 75.4 | 76.9 |
| | | (D) stress relaxing material | | 11.3 | 11.3 | 12.6 | 6.4 |
| | | (E) curing agent | | 4.0 | 4.0 | 4.4 | 3.8 |
| | | (F) curing accelerator | | 0.06 | 0.06 | 0.06 | 0.06 |
| | | (G) radical polymerizable compound | | 4.52 | 4.52 | | 5.13 |
| | | (H) thermoplastic resin | | | | | |
| | content of (B) organic solvent relative to total mass of all components (% by mass) | | | 22.4 | 22.4 | 24.3 | 22.1 |
| | product of the value of the specific surface area ($m^2/g$) of (C) component and the value of the content of (C) component relative to total mass of nonvolatile components (% by mass) | | | 426 | 426 | 437 | 446 |
| resin compositon after drying (resin sheet) | content relative to total mass of (B) organic solvent (% by mass) | organic solvent bp < 120° C. | | 0 | 0 | 0 | 10 |
| | | organic solvent 120° C. ≤ bp < 220° C. | | 100 | 100 | 100 | 90 |
| | | organic solvent bp ≥ 220° C. | | 0 | 0 | 0 | 0 |
| | | aromtic solvent | | 0 | 0 | 0 | 0 |
| | | nonaromatic solvent | | 100 | 100 | 100 | 100 |
| | characteristics | weight reduction rate by heat treatment at 190° C. for 30 min (% by mass) | | 2.0 | 2.0 | 2.0 | 4.0 |
| | | melt viscosity | measured value (poise) | 12,000 | 12,000 | 10,000 | 10,000 |
| | | | evaluation | ○ | ○ | ○ | ○ |

TABLE 1-continued

| | | | | | |
|---|---|---|---|---|---|
| surface irregularity | evaluation | ○ | ○ | ○ | ○ |
| warpage | measured value (mm) | 0.5 | 2.0 | 2.0 | 1.5 |
| | evaluation | ○ | ○ | ○ | ○ |
| dielectric loss tangent | measured value(@10 GHz) | 0.006 | 0.007 | 0.009 | 0.004 |
| | evaluation | ○ | ○ | Δ | ○ |

| | | | | Example | | |
|---|---|---|---|---|---|---|
| | | | | 5 | 6 | 7 |
| resin composition before drying (Resion varnish) | mass of nonvolatile component | (A) epoxy resin | 828EL | 5 | 5 | 3 |
| | | | NC3000L | 1 | 1 | 1 |
| | | | ESN-475V | | | 2 |
| | | (C) inorganic filler | SOC2 | 60 | | 50 |
| | | | SOC4 | | 50 | |
| | | (D) stress relaxing material | elastomer A | 5 | 10 | |
| | | | elastomer B | | | 5 |
| | | | EXL2655 | | | 5 |
| | | (E) curing agent | PC1300-02-65MA | | | 2.99 |
| | | | HPC-8000L-65TM | | | |
| | | | V-03 | | 0.5 | |
| | | | LA3018-50P | 2.95 | | |
| | | | KA-1160 | | 3 | |
| | | (F) curing accelerator | 1B2PZ | | | |
| | | | DMAP | 0.05 | 0.05 | 0.05 |
| | | (G) radical polymerizable compound | BMI-689 | | | |
| | | | maleimide compound A | 4 | 4 | |
| | | (H) thermoplastic resin | YX7200B35 | | | 1.05 |
| | mass of volatile component | (B) organic solvent | MEK (non-aromatic bp 79° C.) | 10 | 15 | 15 |
| | | | Toluene (aromatic bp 110° C.) | | 0.5 | |
| | | | PGM (non-aromatic bp 120° C.) | 2.95 | | |
| | | | PGMEA (non-aromatic bp 146° C.) | 5 | 10 | 5 |
| | | | MAK non-aromatic bp 151° C.) | | | 1.6 |
| | | | Anone (non-aromatic bp 155° C.) | 5 | 5 | 1.95 |
| | | | EDGAC (non-aromatic bp 217° C.) | | | 1 |
| | | | DB (non-aromatic bp 230° C.) | | | |
| | total mass of all components (mass) | | | 101.0 | 104.1 | 94.6 |
| | total mass of nonvolatile components(mass) | | | 78.0 | 73.6 | 70.1 |
| | content relative to total mass of all nonvolatile components (% by mass) | (A) epoxy resin | | 7.7 | 8.2 | 8.6 |
| | | (C) inorganic filler | | 76.9 | 68.0 | 71.3 |
| | | (D) stress relaxing material | | 6.4 | 13.6 | 14.3 |
| | | (E) curing agent | | 3.8 | 4.8 | 4.3 |
| | | (F) curing accelerator | | 0.06 | 0.07 | 0.07 |
| | | (G) radical polymerizable compound | | 5.13 | 5.44 | |
| | | (H) thermoplastic resin | | | | 1.50 |
| | content of (B) organic solvent relative to total mass of all components (% by mass) | | | 22.7 | 28.3 | 25.9 |
| | product of the value of the specific surface area ($m^2/g$) of (C) component and the value of the content of (C) component relative to total mass of nonvolatile components (% by mass) | | | 446 | 306 | 414 |

TABLE 1-continued

| | | | | | | |
|---|---|---|---|---|---|---|
| resin compositon after drying (resin sheet) | content relative to total mass of (B) organic solvent (% by mass) | organic solvent bp < 120° C. | | 10 | 5 | 0 |
| | | organic solvent 120° C. ≤ bp < 220° C. | | 90 | 95 | 100 |
| | | organic solvent bp ≥ 220° C. | | 0 | 0 | 0 |
| | | aromtic solvent | | 0 | 0 | 0 |
| | | nonaromatic solvent | | 100 | 100 | 100 |
| | characteristics | weight reduction rate by heat treatment at 190° C. for 30 min (% by mass) | | 4.0 | 2.0 | 8.0 |
| | | melt viscosity | measured value (poise) | 10,000 | 2,000 | 2,000 |
| | | | evaluation | ○ | ○ | ○ |
| | | surface irregularity | evaluation | ○ | ○ | ○ |
| | | warpage | measured value (mm) | 1.5 | 2.0 | 1.0 |
| | | | evaluation | ○ | ○ | ○ |
| | | dielectric loss tangent | measured value(@10 GHz) | 0.008 | 0.006 | 0.004 |
| | | | evaluation | ○ | ○ | ○ |

TABLE 2

| | | | | | Comparative Example | | | | |
|---|---|---|---|---|---|---|---|---|---|
| | | | | | 1 | 2 | 3 | 4 | 5 |
| resin composition before drying (Rasion varnish) | mass of nonvol-atile component | (A) | epoxy resin | 828EL | 5 | 5 | 5 | 5 | 5 |
| | | | | NC3000L | 1 | 1 | 1 | 1 | 1 |
| | | | | ESN-475V | | | | | |
| | | (C) | inorganic filler | SOC2 | 65 | 40 | 65 | 85 | |
| | | | | SOC4 | | | | | 20 |
| | | (D) | stress relaxing material | elastomer A | 10 | 0.5 | 10 | 10 | 10 |
| | | | | elastomer B | | | | | |
| | | | | EXL2655 | | | | | |
| | | (E) | curing agent | PC1300-02-65MA | | | | | |
| | | | | HPC-8000L-65TM | | | | | |
| | | | | V-03 | 0.5 | 0.5 | 0.5 | 5 | 0.5 |
| | | | | LA3018-50P | | | | | |
| | | | | KA-1160 | 3 | 3 | 3 | 3 | 3 |
| | | (F) | curing accelerator | 1B2PZ | 0.05 | 0.05 | 0.05 | 0.05 | 0.05 |
| | | | | DMAP | | | | | |
| | | (G) | radical polymerizable compound | BMI-689 | 4 | 4 | 4 | 4 | 4 |
| | | | | maleimide compound A | | | | | |
| | | (H) | thermoplastic resin | YX7200B35 | | | | | |
| | mass of volatile component | (B) | organic solvent | MEK (non-aromatic bp 79° C.) | | | | | |
| | | | | Toluene (aromatic bp 110° C.) | 10.5 | 10.5 | 5.5 | 15.5 | 10.5 |
| | | | | PGM (non-aromatic bp 120° C.) | | | | | |
| | | | | PGMEA (non-aromatic bp 146° C.) | 10 | 0.5 | 10 | 10 | 10 |
| | | | | MAK non-aromatic bp 151° C.) | | | | | |

TABLE 2-continued

| | | | Comparative Example | | | | |
|---|---|---|---|---|---|---|---|
| | | | 1 | 2 | 3 | 4 | 5 |
| | | Anone (non-aromatic bp 195° C.) | 5 | 5 | 5 | 5 | 5 |
| | | EDGAC (non-aromatic bp 217° C.) | | | | | |
| | | DB (non-aromatic bp 230° C.) | | | 5 | | |
| | total mass of all components (mass) | | 114.1 | 70.1 | 114.1 | 143.6 | 69.1 |
| | total mass of nonvolatile components(mass) | | 88.6 | 54.1 | 88.6 | 113.1 | 43.6 |
| | content relative to total mass of all nonvolatile components (% by mass) | (A) epoxy resin | 6.8 | 11.1 | 6.8 | 5.3 | 13.8 |
| | | (C) inorganic filler | 73.4 | 74.0 | 73.4 | 75.2 | 45.9 |
| | | (D) stress relaxing material | 11.3 | 0.9 | 11.3 | 8.8 | 23.0 |
| | | (E) curing agent | 4.0 | 6.5 | 4.0 | 7.1 | 8.0 |
| | | (F) curing accelerator | 0.06 | 0.09 | 0.06 | 0.04 | 0.11 |
| | | (G) radical polymerizable compound | 4.52 | 7.40 | 4.52 | 3.54 | 9.18 |
| | | (H) thermoplastic resin | | | | | |
| | content of (B) organic solvent relative to total mass of all components (% by mass) | | 22.4 | 22.8 | 22.4 | 21.2 | 36.9 |
| | product of the value of the specific surface area ($m^2/g$) of (C) component and the value of the content of (C) component relative to total mass of nonvolatile components (% by mass) | | 426 | 429 | 426 | 436 | 207 |
| resin compositon after drying (resin sheet) | content relative to total mass of (B) organic solvent (% by mass) | organic solvent bp < 120° C. | 10 | 20 | 10 | 30 | 20 |
| | | organic solvent 120° C. ≤ bp < 220° C. | 90 | 80 | 60 | 70 | 80 |
| | | organic solvent bp ≥ 220° C. | 0 | 0 | 30 | 0 | 0 |
| | | aromtic solvent | 10 | 20 | 10 | 30 | 20 |
| | | nonaromatic solvent | 90 | 80 | 90 | 70 | 80 |
| | characteristics | weight reduction rate by heat treatment at 190° C. for 30 min (% by mass) | 2.0 | 6.0 | 10.0 | 1.0 | 6.0 |
| | | melt viscosity — measured value (poise) | 16,000 | 8,000 | 1,000 | 60,000 | 1,000 |
| | | melt viscosity — evaluation | ○ | ○ | ○ | x | ○ |
| | | surface irregularity — evaluation | x | ○ | x | — | ○ |
| | | warpage — measured value (mm) | 0.5 | 3.0 | 2.5 | — | 3.0 |
| | | warpage — evaluation | ○ | x | x | — | x |
| | | dielectric loss tangent — measured value(@10 GHz) | 0.006 | 0.004 | 0.010 | 0.005 | 0.010 |
| | | dielectric loss tangent — evaluation | ○ | ○ | x | ○ | x |

As can be seen in Tables 1 and 2, by using the resin sheet including the resin composition layer containing the (A) epoxy resin, the (B) organic solvent, the (C) inorganic filler, and the (D) stress relaxing material, and when the content of the aromatic solvent having a boiling point of less than 120° C. in the (B) component was in the range of 0 to 9% by mass relative to 100% by mass of total of the (B) component, the irregularity after lamination as well as the warpage after curing could be suppressed.

Where a numerical limit or range is stated herein, the endpoints are included. Also, all values and subranges within a numerical limit or range are specifically included as if explicitly written out.

As used herein the words “a” and “an” and the like carry the meaning of “one or more.”

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. A resin sheet-comprising:

a support; and at least one resin composition layer formed on the support, wherein the resin composition layer comprises (A) at least one epoxy resin, (B) at least one organic solvent, (C) at least one inorganic filler, and (D) at least one stress relaxing material, and a content of an aromatic solvent having a boiling point of lower than 120° C. in the (B) component is in a range of 0 to 9% by mass relative to 100% by mass of total of the (B) component, and a product of a value of a content (% by mass) of the (C) component and a value of a specific surface area ($m^2/g$) of the (C) component, when nonvolatile components in the resin composition layer account for 100% by mass, is 414 or more.

2. The resin sheet according to claim 1, wherein a content of the (D) component in the resin composition layer is 1% or more by mass relative to 100% by mass of nonvolatile components in the resin composition layer.

3. The resin sheet according to claim 1, wherein a content of the (C) component in the resin composition layer is 60% or more by mass relative to 100% by mass of nonvolatile components in the resin composition layer.

4. The resin sheet according to claim 1, wherein a content of an organic solvent having a boiling point of lower than 120° C. in the (B) component is in a range of 0 to 30% by mass relative to 100% by mass of total of the (B) component.

5. The resin sheet according to claim 1, wherein a content of an organic solvent having a boiling point of 220° C. or higher in the (B) component is in a range of 0 to 10% by mass relative to 100% by mass of total of the (B) component.

6. The resin sheet according to claim 1, wherein a content of an aromatic solvent in the (B) component is in a range of 0 to 9% by mass relative to 100% by mass of total of the (B) component.

7. The resin sheet according to claim 1, wherein a content of an organic solvent having a boiling point in a range of 120° C. or higher to lower than 220° C. in the (B) component is 85% or more by mass relative to 100% by mass of total of the (B) component.

8. The resin sheet according to claim 1, wherein the (D) component comprises a non-particulate stress relaxing material containing a resin having one or more structures selected from a polybutadiene structure and a polycarbonate structure.

9. The resin sheet according to claim 1, wherein the (D) component comprises a particulate stress relaxing material.

10. The resin sheet according to claim 9, wherein an average particle diameter of the particulate stress relaxing material is 10,000 nm or less.

11. The resin sheet according to claim 1, wherein the resin composition layer further comprises (E) at least one curing agent.

12. The resin sheet according to claim 11, wherein the (E) component comprises one or more curing agents selected from an active ester type curing agent and a carbodiimide type curing agent.

13. The resin sheet according to claim 12, wherein the (E) component comprises the active ester type curing agent.

14. The resin sheet according to claim 1, wherein the resin composition layer further comprises (F) at least one curing accelerator.

15. The resin sheet according to claim 1, wherein the resin composition layer further comprises (G) at least one radical polymerizable compound.

16. The resin sheet according to claim 15, wherein the (G) component has a maleimide group.

17. The resin sheet according to claim 1, wherein a weight reduction rate of the resin composition layer with a side of the resin sheet not in contact with the support exposed to outside air and heat-treated at 190° C. for 30 minutes is in a range of 1 to 10% by mass.

18. The resin sheet according to claim 1, wherein a dielectric loss tangent (Df) of the resin composition layer after curing is 0.0090 or less when measured at 10 GHz and 23° C.

19. The resin sheet according to claim 1, wherein a melt viscosity of the resin composition layer at 100° C. is 50,000 poise or lower.

20. The resin sheet according to claim 1, wherein a content of the (D) component in the resin composition layer is 5% or more by mass relative to 100% by mass of nonvolatile components in the resin composition layer.

21. A method for manufacturing a printed wiring board, the method comprising:

(I) laminating the resin sheet according to claim 1 such that the resin composition layer of the resin sheet is bonded to an inner layer substrate; and (II) forming an insulating layer by curing the resin composition layer.

22. A resin composition comprising:

(A) an epoxy resin;

(B) an organic solvent;

(C) an inorganic filler; and (D) a stress relaxing material, wherein a content of an aromatic solvent having a boiling point of lower than 120° C. in the (B) component is in a range of 0 to 9% by mass relative to 100% by mass of total of the (B) component, and a product of a value of a content (% by mass) of the (C) component and a value of a specific surface area ($m^2/g$) of the (C) component, when nonvolatile components in the resin composition layer account for 100% by mass, is 414 or more.

23. The resin composition according to claim 22, wherein a content of the (D) component in the resin composition is 5% or more by mass relative to 100% by mass of nonvolatile components in the resin composition.

24. A resin sheet comprising:

a support, and at least one resin composition layer formed on the support, wherein the resin composition layer comprises (A) at least one epoxy resin, (B) at least one organic solvent, (C) at least one inorganic filler, and (D) at least one stress relaxing material, and a content of an aromatic solvent having a boiling point of lower than 120° C. in the (B) component is in a range of 0 to 9% by mass relative to 100% by mass of total of the (B) component, wherein a dielectric loss tangent (Df) of the resin composition layer after curing is 0.0090 or less when measured at 10 GHz and 23° C.

25. A resin composition comprising:

(A) an epoxy resin;

(B) an organic solvent;

(C) an inorganic filler; and (D) a stress relaxing material, wherein a content of an aromatic solvent having a boiling point of lower than: 120° C. in the (B) component is in a range of 0 to 9% by mass relative to 100% by mass of total of the (B) component, wherein a dielectric loss tangent (Df) of the resin composition layer after curing is 0.0090 or less when measured at 10 GHz and 23° C.

* * * * *